United States Patent
Umezawa et al.

[11] Patent Number: 5,994,756
[45] Date of Patent: Nov. 30, 1999

[54] SUBSTRATE HAVING SHALLOW TRENCH ISOLATION

[75] Inventors: Kaori Umezawa, Kanagawaken; Norihiko Tsuchiya, Tokyo; Yoshiaki Matsushita, Kanagawaken; Hiroyuki Kamijou, Kanagawaken; Atsushi Yagishita, Kanagawaken; Tsunehiro Kita, Kanagawaken, all of Japan

[73] Assignee: Kabushiki Kaisha Toshiba, Kawasaki, Japan

[21] Appl. No.: 08/751,438

[22] Filed: Nov. 20, 1996

[30] Foreign Application Priority Data

Nov. 21, 1995 [JP] Japan .................................. 7-302993

[51] Int. Cl.$^6$ .............................. H01L 27/04; H01L 23/58
[52] U.S. Cl. ......................... 257/510; 257/515; 257/517; 257/374; 257/396
[58] Field of Search .................................. 257/374, 396, 257/397, 510, 647, 513, 514, 515, 517

[56] References Cited

U.S. PATENT DOCUMENTS

| 4,506,434 | 3/1985 | Ogawa et al. ........................ 257/374 X |
| 4,571,819 | 2/1986 | Rogers et al. ........................ 257/397 X |
| 4,593,459 | 6/1986 | Poppert et al. ....................... 257/374 X |
| 5,013,680 | 5/1991 | Lowrey et al. . |
| 5,763,932 | 6/1998 | Pan et al. ................................. 257/510 |

FOREIGN PATENT DOCUMENTS

| 0 570 321 | 11/1993 | European Pat. Off. . |
| 0 606 758 | 7/1994 | European Pat. Off. . |
| 41 33 219 | 6/1992 | Germany . |
| 63-76352 | 4/1988 | Japan . |
| 4-273462 | 9/1992 | Japan . |

OTHER PUBLICATIONS

Wolf, et al., "Silicon Processing for the VLSI Era," 1986, pp. 198–200.

C. J. Brinker, et al. "Sol–Gel Transition in Simple Silicates", Journal of Non–Crystalline Solids 82, (pp. 117–126), North–Holland, Amsterdam, 1986.

Electronics & Communications in Japan, Part 2, vol. 78, No. 10, pp. 65–72, Oct. 1, 1995, Takeshi Furusawa, et al., "New Reflowable Organic Spin–On Glass for Advanced Interlevel Dielectric Planarization".

*Primary Examiner*—John Guay
*Attorney, Agent, or Firm*—Oblon, Spivak, McClelland, Maier & Neustadt, P.C.

[57] ABSTRACT

A semiconductor substrate having a shallow trench isolation (STI) structure and a method of manufacturing the same are provided, i.e., an isolation substrate in which grooves are selectively formed at predetermined locations of the semiconductor substrate and oxide films using organic silicon source as material are buried in the grooves as buried oxide films. The present invention is characterized in that the buried oxide films are annealed at a predetermined temperature within the range of 1100 to 1350° C. before or after planarization of the semiconductor substrate such that ring structures of more than 5-fold ring and ring structures of less than 4-fold ring are formed at predetermined rates in the buried oxide films. The above annealing allows stress of the oxide film buried in the grooves to be relaxed. Hence, the generation of dislocation is suppressed.

16 Claims, 15 Drawing Sheets

T<1100°C

ASPECT RATIO OF DEPTH TO WIDTH OF THE GROOVE

SUBSTRATE HAVING SHALLOW TRENCH ISOLATION

BACKGROUND OF THE INVENTION

1. Field of the Invention

The present invention relates to a substrate for a semiconductor integrated circuit such as LSI and a method of manufacturing the same and, more particularly, to element isolation technique for a semiconductor integrated circuit.

2. Description of the Prior Art

To fabricate an LSI, it is necessary to form element isolation regions for electrically isolating one device region from another device region around respective device regions in which active elements such as transistor or passive elements such as resistor, capacitor, etc. are arranged. In the development of MOSLSI technology and bipolar LSI technology, element isolation technique for forming the element isolation region has been always one of important technical themes. Importance of such element isolation technique would be increased more and more in future. One epoch-making development in the history of the element isolation technique was LOCOS (LOCal Oxidation of Silicon) technique capable of partitioning the device region and the element isolation region in a self-aligned manner. In LOCOS technique (LOCOS method), as shown in FIG. 1, selective oxidation is effected using a nitride ($Si_3N_4$) film 88 as a mask, and an oxide film ($SiO_2$ film) 82 formed on a Si surface without $Si_3N_4$ film 88 is then used as an insulating layer (such as a field oxide layer) for the element isolation region. It is not too much to say that prosperity of LSI industry of the day is brought out by the LOCOS technique. However, with the drive to manufacture ever more complex and fine pattern in the order of submicron to deep submicron, this LOCOS technology is coming up to the limit. The greatest problems are lateral encroachment of the device region (active region) due to so-called bird's beak and generation of crystal defects due to local stress caused when the field oxide film is formed. Especially the bird's beak serves as an impediment factor in high integration for VLSI or ULSI, a thickness of the oxide film 82 must be thinned to lessen encroachment due to the bird's beak and to accelerate miniaturization. However, if the thickness of the oxide film 82 is made thin, the problem to lower the device breakdown voltage arises. In order to overcome this problem, various improvements of LOCOS method and novel isolation techniques have been proposed. For example, as improved element isolation techniques based on the LOCOS method, improved coplanar method, direct nitride film mask method, SWAMI (Side WAll Masked Isolation), and so on have been known. Further, selective epitaxial method, U-groove method, and the like have been proposed. In addition to these element isolation techniques, an oxide film burying method called BOX (Buried OXide) method and shown in FIG. 2 is given attention as element isolation technique for VLSI, etc. on the order of submicron and deep submicron. In the oxide film burying method, after U-grooves are formed in a silicon substrate 5, insulating material 77 such as $SiO_2$ is deposited by CVD method, or the like to bury into the U-grooves.

In insulating film deposition technique used in BOX method, various requirements such as uniformity, planarization, step coverage, film quality, low temperature in process, and the like are imposed. In particular, step coverage and low temperature in process are important. In manufacturing the semiconductor device such as giga scale integration circuit (GSI) which requires accelerated high integration more and more, the low temperature insulating film with high quality is required. In response to this requirement, LTO (Low Temperature Oxide) film which is deposited by CVD technique using monosilane ($SiH_4$), $N_2O$, etc. formed at relatively low temperature (300 to 450° C.) has been known in the prior art. In general, but according to conditions, LTO oxide film has poor step coverage and is inferior in film quality. The oxide film formed by atmospheric pressure CVD or low pressure CVD exhibits tensile stress and therefore has small crack immunity.

In view of these requirements, recently CVD technique using organic silicon based material representative of TEOS (tetraethylorthosilicate; $Si(OC_2H_5)_4$) has been researched positively. This is because, for example, the insulating film can be formed at low temperature of less than 450° C. by virtue of reaction between TEOS and $O_3$ and step coverage is excellent.

In BOX method shown in FIG. 2, the grooves (trenches) having a relatively shallow depth, called shallow trench isolation (STI) method, is of advantage for miniaturization. Although this STI method is advantageous in a respect of miniaturization compared to the LOCOS method, stress is caused in the semiconductor substrate by annealing in LSI manufacturing step—during or after forming the element isolation region—due to thermal expansion coefficient mismatch between the semiconductor substrate (such as silicon) in which active elements, etc. are formed and the insulating material (e.g., silicon oxide) to be buried in the grooves. The thermal expansion coefficient mismatch generates crystalline defects such as dislocation 12 as shown by thick solid lines in FIG. 2. In particular, in case the silicon oxide is formed by organic silicon source, it is difficult in the existing state to obtain high purity organic silicon source because of limitation in a material refining technique for the organic silicon source. Therefore, impurities (e.g., $H_2O$, adulterant organic substance) other than silicon oxide ($SiO_2$) remain or are absorbed immediately after the silicon oxide is deposited.

For this reason, various problems are caused since these impurities are dissociated by succeeding annealing at 800 to 1000° C. Usually moisture is included at 100 to 20 ppm as an impurity in the organic silicon source material. For this reason, in the silicon device, for example, excessive compressive stress is applied to the silicon substrate due to film shrinkage caused by dissociation of moisture included in the buried oxide film as well as difference of thermal expansion coefficient between the silicon substrate and buried $SiO_2$ (buried oxide film). Furthermore, in the conventional STI structure shown in FIG. 2, crystal defects are readily introduced into the substrate in thermal process in device manufacturing steps during or after forming the element isolation region. That is, in the conventional element isolation technique based on the STI method using organic silicon source, there are problems of generation, amplification, and propagation of crystalline defects such as dislocation 12. And electric characteristics such as the breakdown voltages, junction leakage currents and carrier lifetime are readily degraded since a lot of crystalline defects are generated in the device region (active layer region), and metal impurities are easily trapped by these crystalline defects. These defects degrade memory retention characteristics.

In particular, in actual LSI manufacturing processes, there are caused stress caused by the element isolation region and another stress caused by damage generated ion implantation and caused by various multilayer films such as metal electrode film, interlayer insulating film, and the like having different purposes, so that crystalline defects easily occur. In addition, a synergistic effect between crystalline defects due to the STI structure and crystalline defects due to other reasons appears, and crystalline defects caused in the substrate easily trap metal impurities. For this reason, in the conventional STI method, owing to presence of crystalline defects in the active layer (device region), junction leakage current is increased and electric failures such as low dielectric breakdown voltage of the gate oxide film are caused. Accordingly, development of element isolation technique not to generate crystalline defects in the device region is an important theme to be solved in future miniaturized LSI manufacturing.

In summary, in the element isolation technique required for miniaturized GSI, ULSI, VLSI, and the like, various requirements such as bird's-beak-free, crystalline-defect-free isolation, surface evenness (planar surface), and so on are needed. In the STI method, there is no trouble concerning bird's beak, but surface evenness and suppression of the crystalline defects still remain as the important subject to be solved.

SUMMARY OF THE INVENTION

In the light of the above problems, it is an object of the present invention to provide a structure of a semiconductor substrate which is capable of reducing crystalline defects generated in a device region due to stress of $SiO_2$ when an STI method or a buried element isolation method analogous to the STI method is employed and is applicable to a semiconductor device having a high integration density.

It is another object of the present invention to provide a method of manufacturing a semiconductor substrate which is capable of reducing crystalline defect due to stress of $SiO_2$ and concurrently increasing high packing density.

In order to achieve the above objects, as shown in FIGS. 3E, 8F, 10G and 14E, a first aspect of the present invention is that an element isolation semiconductor substrate comprising a plurality of grooves 6 formed in the semiconductor substrate, buried oxide films 71 formed in the grooves 6, and device regions sandwiched in between the grooves 6 and the grooves 6. The buried oxide films 71 are oxide films which are formed by any of organic silicon based CVD method, spin-on-glass coating method being called a so-called SOG (Spin-On-Glass) method, and anodic oxidation method, and then annealed at a temperature of 1100 to 1350° C. Where the term "a plurality of grooves 6" means that plural grooves can be observed in a cross-section if the semiconductor substrate is viewed from a predetermined cross-sectional plane, and therefore these grooves may be formed as one continuous groove on a planar pattern. For instance, a plurality of grooves 6 shown in FIG. 3A are formed as a merged region to surround a device region in which, as shown in the center of FIG. 3E, a MOS transistor having an $n^+$ source region 91, an $n^+$ drain region 92, and the like is formed. Of course, the device region need not be fully surrounded by grooves. The technical feature of the present invention is also accomplished by the structure in which the device region is partially surrounded by grooves such as shown in FIG. 12C. Further, although the object of the present invention can be attained even if the buried oxide films are annealed at a higher temperature in excess of 1350° C., such problems arise in this case that an annealing apparatus consisting of a reaction tube, a furnace, etc. is hard to be constituted and contamination of the semiconductor substrate from the furnace is caused. Thus, taking account of state of existing technology, annealing to be effected at such extremely higher temperature is not practical.

Preferably, in the first aspect, an aspect ratio $d/l_1$ which is defined by a dimensional ratio of a depth d of the grooves 6 to a width $l_1$ of openings of the grooves 6 is less than a specific value, namely 10. As shown in FIG. 11, since the limitation has become obvious experimentally that defect density observed in the device region is reduced at an aspect ratio of less than 10, and defect density caused by stress of the buried oxide film 71 is not reduced at an aspect ratio of more than 10 because of insufficient reduction of such stress, the first aspect of the present invention can be achieved below the specific value of the aspect ratio. Further, the groove 6 preferably has the width $l_1$ of openings giving a minimum space width $l_1$. The device region has a width $l_2$ giving a minimum line width $l_2$. The cyclic line and space patterns each having a line-and-space ratio $l_1/l_2$ of less than 1.5 are formed at a surface of the semiconductor substrate. As shown in FIG. 13, if the line-and-space ratio $l_1/l_2$ is more than 1.5, stress of the oxide film cannot be reduced by annealing at a temperature of 1100 to 1350° C. to thus generate crystalline defects. This line-and-space ratio $l_1/l_2$ is defined only in a certain direction as shown in FIGS. 12B and 12C. For example, the ratio $l_1/l_2$ is measured along the line X—X in FIG. 12B, and a dimensional ratio of the patterns which do not constitute the minimum line width or the minimum space width may be selected beyond 1.5 in the direction orthogonal to the line X—X, i.e., in the direction orthogonal to a surface of the sheet of FIG. 12A. In FIG. 12C, there are two directions of line-and-space ratios, namely $l_{1x}/l_{2x}$ along the line X—X and $l_{1y}/l_{2y}$ along the line Y—Y orthogonal to line X—X. In this case, it is enough that one of the line-and-space ratios satisfies the above condition. Namely, the conditions $$l_{1y}/l_{2y} \leq 1.5 \tag{1}$$

$$l_{1x}/l_{2x} \geq 1.5 \tag{2}$$

and vice versa are enough to reduce the stress between oxide film 71 and semiconductor substrate. In general, if the circuit pattern include two directions of line-and-space ratios, it is enough one of them to satisfy $$l_1/l_2 \leq 1.5 \tag{3}$$

As shown in FIGS. 3E, 8F, 10G and 14E as in the first aspect, a second aspect of the present invention is that an element isolation semiconductor substrate comprising buried oxidation films 25, 71 formed of the non-crystalline silicon oxide film which includes ring structures of more than 5-fold ring and ring structures of less than 4-fold ring at respective predetermined rates.

Where the term "predetermined rates" denotes, as shown in FIGS. 6A and 6B, the rates of respective peak integrated intensities, detected by Raman scattering spectroscopy, corresponding to 3-fold ring (tri-siloxane), 4-fold (tetrasiloxane), and multi-fold ring or higher order rings more than 5-fold structures to a total integrated intensity of $SiO_2$ film. In other words, as shown in FIGS. 6A and 6B, such term denotes rates of respective Raman intensities defined in a wave number region ranging from 300 $cm^{-1}$ to 700 $cm^{-1}$, which is set as the total intensity. More particularly, as shown in FIG. 7, if the non-crystalline silicon oxide film ($SiO_2$ film) satisfies at least one of the following two conditions:

(i) integrated Raman intensity ratio corresponding to higher order ring more than 5-fold ring to a total integrated Raman intensity is substantially more than 85%, and (ii) integrated Raman intensity ratio corresponding to 4-fold ring or 3-fold ring to the total integrated Raman intensity is substantially less than 15%, stress caused in the buried oxide films 25, 71 and stress caused at the boundary between the buried oxide films 25, 71 and the semiconductor substrate 5, 16, 23 can be relaxed and generation of dislocation in the device region can be suppressed. Where the term "substantially more than 85%" means that, as shown using error bars in FIG. 7, the ratio up to about 80% or more is allowable. And the term "substantially less than 15%" means that the ratio up to about 20% or less is allowable. Therefore, according to the structure based on the second aspect of the present invention, leakage current through pn junction formed in the device region can be reduced, so that highly integrated circuit having good characteristics can be accomplished. It is of course that background components in Raman spectra have already been removed from the calculation of integrated intensity according to the second aspect of the present invention.

As shown in FIGS. 3A to 3E or FIGS. 8A to 8F, a third aspect of the present invention is to include respective steps as follows. In other words, there are included at least (a) as shown in FIGS. 3A or 8D, a first step of forming a plurality of grooves 6 at part of a surface of the semiconductor substrate 5, 16, (b) as shown in FIGS. 3B, 3C or 8E, a second step of burying oxide films 7, 71 in the grooves 6 in terms of an organic silicon based CVD method, and (c) a third step of annealing the oxide films 71 at a substrate temperature of 1100 to 1350° C. Where the term "organic silicon based CVD method" means a CVD using organic silicon material such as TEOS (Tetraethylorthosilicate; $Si(OC_2H_5)_4$), TMOS (Tetramethoxysilane; $Si(OCH_3)_4$), TPOS (Tetrapropoxysilane; $Si(OC_3H_7)_4$), or DADBS (Diacetoxyditertiarybutoxysilane; $(C_4H_9O)_2Si$—$(OCOCH_3)_2$) as source material.

Preferably, the organic silicon based CVD method in the second step is any of atmospheric pressure CVD method, low pressure CVD method, plasma CVD method, photo CVD method, and liquid phase CVD method. As the atmospheric pressure CVD method, so-called ozone system atmospheric pressure CVD using ozone ($O_3$) formed by introducing $O_2$ into an ozonizer and then discharging $O_2$ may be used. The low pressure CVD method is termed as CVD by which reaction of TEOS-$O_3$ is carried out under low pressure such as 6.7 kPa, for instance. With the use of plasma discharge at about 13.56 MHz or 150 KHz, the plasma CVD method may be conducted employing a gas source such as TEOS, $O_2$, or He. The photo CVD method may be carried out by photoreaction using mainly photon energy of either an excimer laser beam such as ArF (193 nm), KrF (249 nm), XeCl (308 nm), or XeF (350 nm), or ultraviolet rays emitted from high-pressure mercury lamp, mercury-xenon lamp, and the like. The liquid phase CVD method is such CVD which is effected using $O_2$ excited by RF discharge and TMS (Tetramethylsilane; $Si(CH_3)_4$) at −40° C., for example.

Preferably, the annealing in the third step is carried out in any one of reductive gas such as $H_2$, inert gas such as He, Ne, Ar, Kr, or Xe, $O_2$, $N_2$, HCl, CO, and $CO_2$, or in a gas mixture consisting of any mixture of two kinds of gas selected from these gases.

In forming the buried oxide film in the second step, it is preferable in particular to include steps of depositing the oxide film 7 thicker than a depth of the grooves, as shown in FIG. 3B, and then planarizing a surface of a resultant structure until a surface of the semiconductor substrate 5 is substantially exposed, as shown in FIG. 3C. Where the term "surface of the semiconductor substrate is substantially exposed" means that it is not necessarily required to etch back the resultant structure until the surface of the semiconductor substrate 5 is completely exposed. Therefore, the term is also true of a case where the surface of the semiconductor substrate 5 is planarized by etching back the resultant structure to remain an extremely thin oxide film having a thickness of 50 to 100 nm or about 300 nm on the surface of the semiconductor substrate 5 if such thin oxide film is required in later steps, for example. Either of the planarizing step and the annealing step may be carried out earlier. Accordingly, in contrast with the above, only a step of depositing an oxide film thicker than a depth of the grooves formed in the first step in terms of an organic silicon based CVD method may be carried out as the second step, then a planarizing step of a surface of a resultant structure may be effected as a fourth step after annealing in the third step.

An important respect in the third aspect of the present invention is an annealing temperature. FIG. 4 shows the annealed results of the element isolation semiconductor substrate which is subjected to annealing at a 50° C. interval in the range of 1000 to 1350° C. after organic silicon based CVD. In other words, this is the results of Scanning Electron Microscope (SEM) observation on the surface of the element isolation semiconductor substrate, on which a MOS integrated circuit is formed by forming elements such as MOS transistor in the 0.3 $\mu$m wide device region (SDG region) between the grooves after the element isolation regions are formed. Namely, the number of etch pits actualized by selective etching, after all the layers stacked on the surface of substrate are removed, is counted by SEM. As shown in FIG. 4, it is to be noted that dislocations are generated frequently in the lower annealing temperature of less than 1100° C. This dislocation is similar to the dislocation 12 which is generated in the conventional STI substrate and indicated by thick solid line in FIG. 2

Data in FIG. 4 have been collected in such a manner that etch pits (dislocation pits) are first actualized by selective etching, then the number of etch pits is counted with respect to five points in a square region of 1 mm×1 mm by observing the etch pits via SEM view, and then these density values are averaged. The dislocations 12 being similar to those indicated by the thick solid line in FIG. 12 have occurred at a rate of about $10/\mu m^2$ within the annealing temperature range from 1000 to 1100° C., but the number of dislocations has been reduced at the higher annealing temperature, i.e., within the annealing temperature range of the present invention. FIG. 5 shows measured results in case the MOS transistor has been formed in the SDG region isolated by the element isolation regions and then the junction leakage characteristic of an $n^+$-p diode ($n^+$-p well) which corresponds to the pn junction structure in the MOS transistor has been measured. It can be seen that leakage current is reduced in the substrate which has been annealed in excess of 1100° C. This result reflects that dislocation in the $n^+$-p junction causing the leakage current has been suppressed and indicates that stress control in the buried oxide film according to the present invention is effective for suppression of the dislocation and reducing in the leakage current. It is evident that similar result has been achieved if such stress control is applied to the element isolation of the bipolar integrated circuit shown in FIG. 9. It would be found that stress of $SiO_2$ can be much more relaxed by annealing within the temperature range (1100 to 1350° C. according to the present invention compared to annealing at less than 1000° C., so that junction leakage current can be reduced.

A fourth aspect of the present invention is to comprise at least, (a) a first step of forming a silicon direct bonding oxide film 24 on a first principal surface of a first semiconductor substrate 23 in terms of an organic silicon based CVD method, as shown in FIG. 10A, then carrying out first annealing at a substrate temperature of 1100 to 1350° C., and then planarizing a surface of the silicon direct bonding oxide film 24 formed on the first principle surface of the first semiconductor substrate 23, as shown in FIG. 10B. Otherwise a first step (another first step) of forming a silicon direct bonding oxide film 24 on a first principal surface of a first semiconductor substrate 23 in terms of an organic silicon based CVD method, as shown in FIG. 10A, then planarizing a surface of the silicon direct bonding oxide film formed on the first principal surface of the first semiconductor substrate 23, as shown in FIG. 10B, and then carrying out first annealing at a substrate temperature of 1100 to 1350° C.;

(b) a second step of directly bonding the first semiconductor substrate 23 to a second semiconductor substrate 26 being different from the first semiconductor substrate 23 via the silicon direct bonding oxide film 25, the surface of the oxide film 25 is planarized, as shown in FIG. 10B, to form a so-called SOI (Silicon-On-Insulator) substrate, then grinding a back surface of the first semiconductor substrate 23, as shown in FIG. 10C, and/or adjusting the first semiconductor substrate 23 to a predetermined thickness by means of polishing, etching, or the like;

(c) a third step forming a plurality of grooves 6 at part of a second principal surface of the first semiconductor substrate 23 which is located on a side not to mate with the second semiconductor substrate 26, as shown in FIG. 10D;

(d) a fourth step of forming buried oxide films 7 in the grooves 6 formed by the third step in terms of the organic silicon based CVD method, as shown in FIG. 10E; and (e) a fifth step of carrying out second annealing of the buried oxide films 7 at a substrate temperature of 1100 to 1350° C.

Where the first semiconductor substrate 23 and the second semiconductor substrate 26 are not always formed as the same kind of semiconductor substrate, but may be formed by different kinds of semiconductor such as Si and SiC. In particular, IV, III–V, and II–VI semiconductors and non-crystalline material (such as polysilicon, amorphous silicon) other than single crystalline Si may be selected as materials for the first semiconductor substrate 23 and the second semiconductor substrate 26. In case first annealing in the first step may be omitted, annealing should be conducted at 1100 to 1350° C. under the same condition as the first annealing upon silicon direct bonding in the second step. Alternatively, in case first annealing may be omitted, the second annealing in the fifth step can be substituted for the first annealing.

According to the structure based on the fourth aspect of the present invention, stress of the buried oxide films 71 and the silicon direct bonding oxide film 25 can be reduced and further generation of crystalline defect such as dislocations and stacking faults in the device region can be suppressed.

A fifth aspect of the present invention is to comprise at least, (a) a first step of forming a plurality of grooves on part of a first principal surface of a first semiconductor substrate 23, as shown in FIG. 14A;

(b) a second step of forming a silicon direct bonding oxide film 25 on the first principle surface of the first semiconductor substrate in terms of an organic silicon based CVD method, as shown in FIG. 14A, then carrying out annealing of a resultant structure at a substrate temperature of 1100 to 1350° C., and then planarizing a surface of the silicon direct bonding oxide film 25 formed on the first principal surface of the first semiconductor substrate 23, as shown in FIG. 14B. Otherwise, another second step of forming a silicon direct bonding oxide film on the first principal surface of the first semiconductor substrate in terms of an organic silicon based CVD method, as shown in FIG. 14A, then planarizing a surface of the silicon direct bonding oxide film 25 formed on the first principal surface of the first semiconductor substrate 23, as shown in FIG. 14B, and then carrying out annealing at a substrate temperature of 1100 to 1350° C.; and (c) a third step of directly bonding the first semiconductor substrate 23 to a second semiconductor substrate 26 being different from the first semiconductor substrate 23 via the silicon direct bonding oxide film 25, as shown in FIG. 14C, and then thinning a thickness of the first semiconductor substrate 23 until part of the silicon direct bonding oxide film 25 is exposed to thus form device regions surrounded by the silicon direct bonding oxide film 25, as shown in FIG. 14D.

Where the first semiconductor substrate 23 and the second semiconductor substrate 26 are not always formed as the same kind of semiconductor substrate, but may be formed by different kinds of semiconductor such as Si and SiC. Namely, IV, III–V, and II–VI semiconductors and non-crystalline material other than single crystal may be selected as materials for the first semiconductor substrate 23 and the second semiconductor substrate 26.

According to the fifth aspect of the present invention, since the buried oxide films 25 and the silicon direct bonding oxide film 25 can be formed simultaneously in terms of one time organic silicon system CVD, the number of step can be reduced in contrast to the fourth aspect of the present invention. In other words, the silicon direct bonding oxide film 25 exposed on a surface of the first semiconductor substrate 23 may also function as the buried oxide films 25. Fewer annealing steps in the fifth aspect of the present invention compared to the fourth aspect of the present invention may contribute to lower temperature processes. Further, the annealing in the second step can be substituted by the annealing for silicon direct bonding in the third step.

According to the structure based on the fifth aspect of the present invention, stress of the buried oxide films 25 and the silicon direct bonding oxide film 25 can be reduced and also generation of crystalline defect such as dislocations and stacking faults in the device region can be suppressed.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
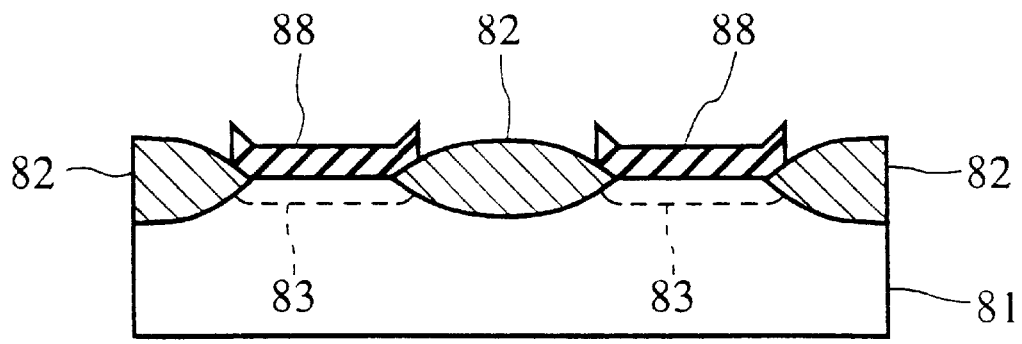
FIG. 1 is a cross-sectional view showing a structure of an element isolation semiconductor substrate by a representative LOCOS method as the prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

(First Embodiment)

Figure 3A:
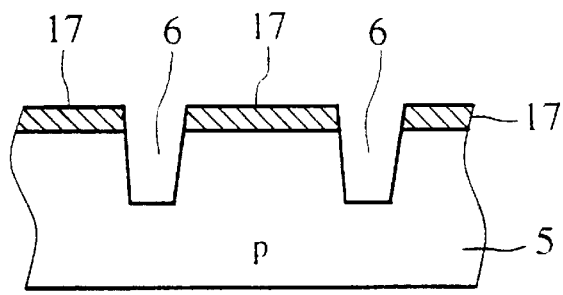
FIGS. 3A to 3E are cross-sectional views showing steps for manufacturing a buried element isolation semiconductor substrate for use in a MOS integrated circuit according to a first embodiment of the present invention.
Figure 3B:
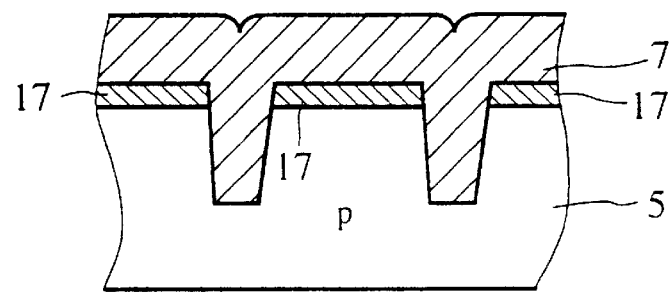
Figure 3C:
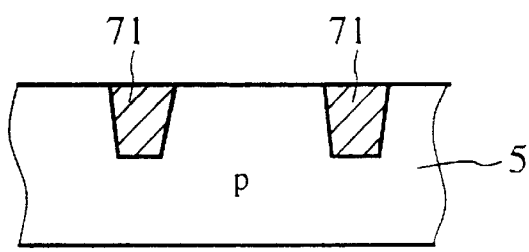
Figure 3D:
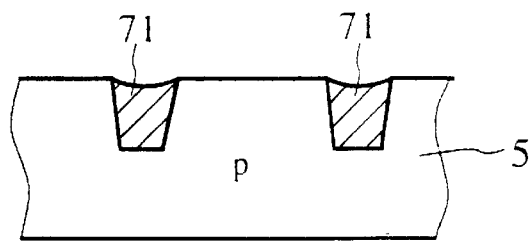
Figure 3E:
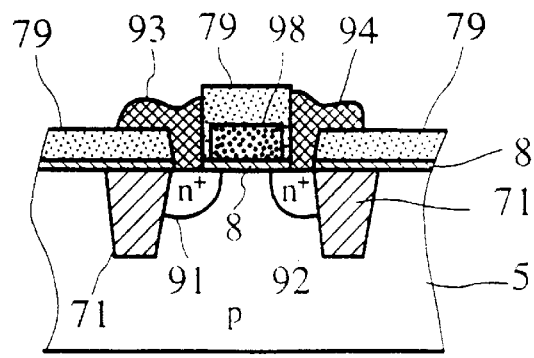

FIG. 3E shows a sectional structure of buried element isolation semiconductor substrate, or shallow trench element isolation (STI) semiconductor substrate for MOS integrated circuit according to a first embodiment of the present invention. FIGS. 3A to 3D are cross-sectional views showing manufacturing steps to come up to the final structure shown in FIG. 3E. In the element isolation semiconductor substrate according to the first embodiment of the present invention, buried oxide films 71 are formed in the grooves 6 at a surface of the semiconductor substrate 5, as shown in FIG. 3E, and a MOS transistor having an $n^+$ source region 91, an $n^+$ drain region 92, a gate oxide film 8, a polysilicon gate electrode 98, a source electrode 93, a drain electrode 94, and an interlayer insulating film 79 is formed in the device region sandwiched in between the buried oxide films 71, 71.

Figure 2:
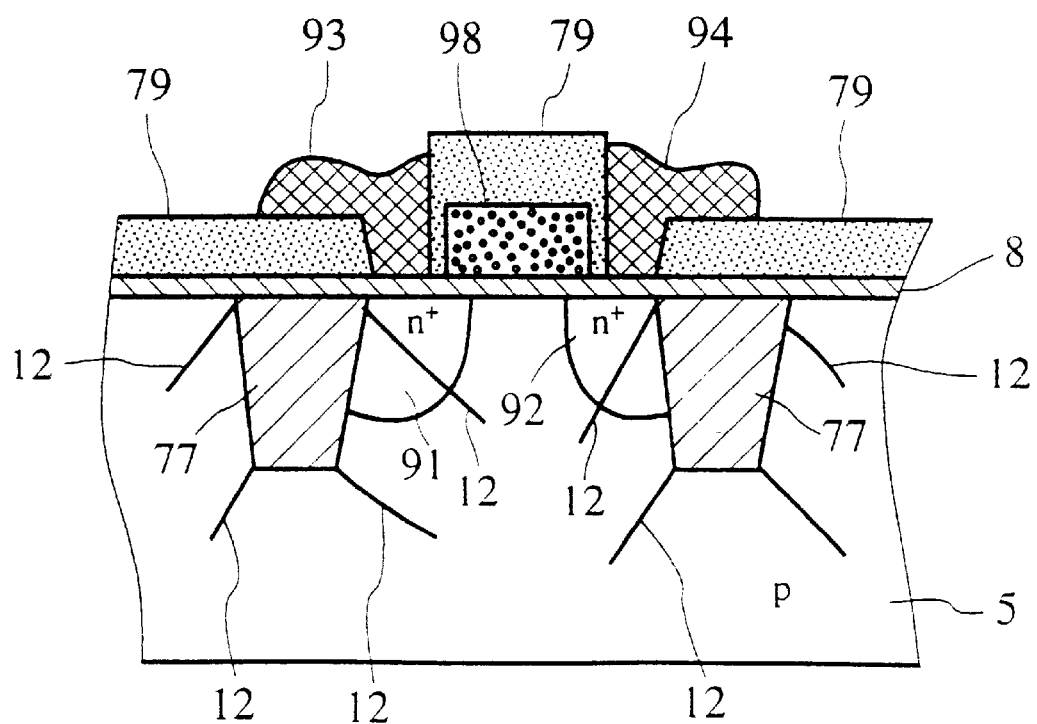
FIG. 2 is a schematic cross-sectional view showing dislocations generated in a substrate manufactured by the conventional buried element isolation technique.

In the MOS integrated circuit formed in the element isolation semiconductor substrate according to the first embodiment of the present invention, stress in the buried oxide films 71 can be relaxed by executing annealing explained hereinbelow and accordingly no dislocation 12 explained in the prior art column (shown in FIG. 2) occurs. For this reason, leakage current through the pn junction due to such dislocation can also be reduced.

The element isolation semiconductor substrate according to the first embodiment of the present invention will be manufactured by following steps.

(a) To begin with, a silicon oxide film 17 of 100 nm thickness, for example, is formed on a (100) surface of the mirror surface semiconductor substrate by steam oxidation method (wet oxidation method) etc., then a photoresist (not shown) is coated on a surface of the silicon oxide film 17, then the silicon oxide film 17 is etched by photolithography method using the photoresist as a mask to form a silicon etching mask pattern and to expose a remaining surface of the silicon substrate 5. After removing the photoresist, as shown in FIG. 3A, exposed portions of the silicon substrate 5 are formed into grooves 6 with a width of 0.3 μm and a depth of 1 μm in terms of RIE using the oxide film 17 as a mask. The aspect ratio of the groove is 1/0.3=3.3 in this case. For example, such RIE for the silicon substrate 5 may be performed while supplying gas mixture consisting of $CF_4$ and $H_2$ at a pressure of 1.3 Pa and applying high-frequency power of 13.56 MHz at 0.22 W/cm². Alternatively, when RIE may be performed, gas mixture of consisting of $SF_6$ and $O_2$, $CCl_4$, or the like may be supplied.

(b) Then, as shown in FIG. 3B, an oxide film 7 is deposited using organic silicon source such as TEOS (Si$(OC_2H_5)_4$) after the substrate is rinsed. Prior to deposition of the oxide film 7, a thin thermal oxidation film or $Si_3N_4$ film may be grown. In order to perfectly bury the grooves 6, the oxide film 7 is formed on the entirety of the Si substrate to have a 1.1 μm thickness, for example, which is thicker than the depth of the grooves 6. As material buried in the grooves 6, organic silicon source to which oxidizing agent such as $N_2O$, $O_2$, or $O_3$ is added may also be employed. In addition, the grooves 6 may be buried by the silicon oxide film in terms of CVD using, as source material, organic silicon source, silicon-hydrogen compound such as $SiH_4$, or silicon chloride such as $SiCl_4$ alone. Otherwise mixed material composed of two kinds of the above materials may be also used as CVD source material. Also oxide may be added to respective CVD materials.

(c) Subsequently, as shown in FIG. 3C, except for buried groove regions, the silicon substrate 5 is exposed and planarized by etching back in terms of Chemical Dry Etching (CDE) method.

(d) Since the buried oxide film 71 formed of organic silicon source includes considerably impurities such as moisture other than $SiO_2$, annealing of the buried oxide film 71 is effected at 1100 to 1350° C. in a state as shown in FIG. 3D. According to annealing, minute curvatures (concave portions) occur on respective grooves, as shown in FIG. 3D. This process may be carried out as annealing in $N_2$ gas ambient for two hours, for example, but the similar results may be obtained if $O_2$, HCl, reductive gas, or inert gas may be used as the atmosphere gas upon annealing. Although such a case has been discussed that annealing is imposed just after the planarization of substrate surface by removing the oxide film other than the element isolation region, the similar effect can be achieved by another manufacturing step order that the oxide film 7 is firstly annealed and after that the excess oxide film is removed from the substrate other than the element isolation region to planarized the substrate surface.

(e) Finally, as shown in FIG. 3E, a MOS transistor is formed in the device region, i.e, SDG region (having a width of 0.3 $\mu$m) formed between the grooves 6. By employing standard MOS process used to form an $n^+$ drain region 92, the MOS transistor may be formed in a self-aligned fashion using a polysilicon gate 78. Hence, their explanation will be omitted here.

Figure 4:
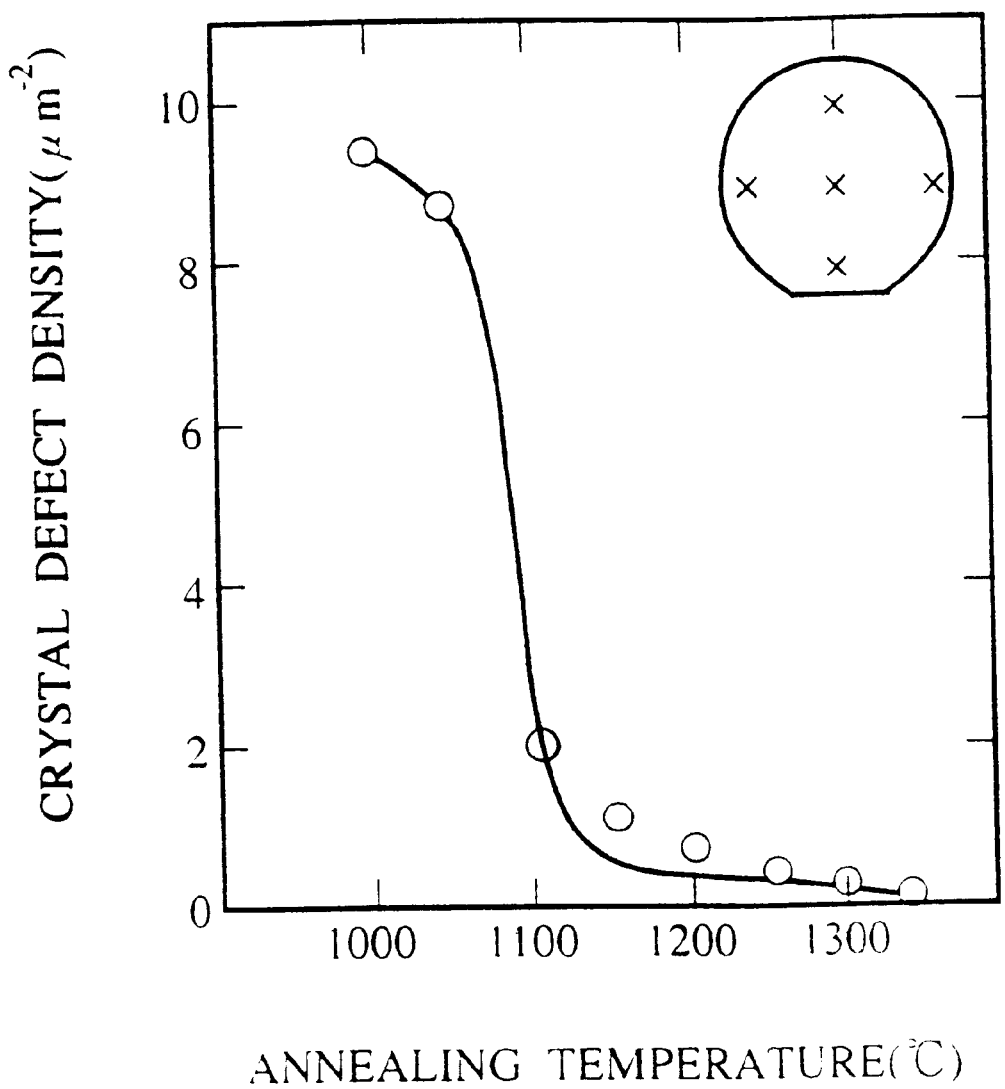
FIG. 4 is a view showing a relationship between annealing temperature of the buried oxide film and crystalline defect density generated in a device region.

As shown in FIG. 4, dislocation density in the device region measured after the final structure of the MOS transistor has been formed in the device region shown in FIG. 3E is less than $1/\mu m^2$. Measured results of dislocation density shown in FIG. 4 are data which have been collected according to SEM view after the sample is subjected to selective etching, and then averaged about five points in a 1 mm×1 mm square region.

Figure 5:
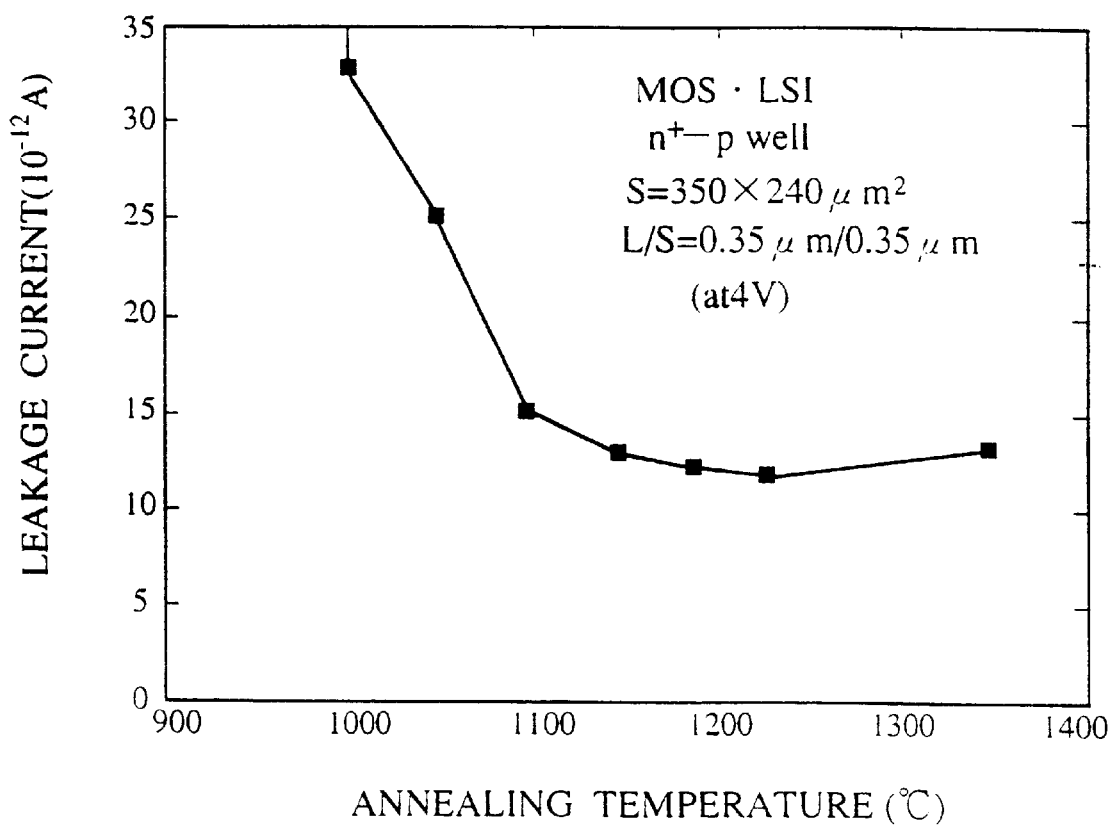
FIG. 5 is a view showing a relationship between annealing temperature of the buried oxide film and pn junction leakage current generated in MOSLSI formed in the device region.

FIG. 5 shows leakage current through the pn junction diode in TEG pattern corresponding to the MOS transistor structure. More particularly, as shown in FIG. 5, leakage current which flows through the $n^+$-p junction formed between an $n^+$ source region 91 and a p well 5 can be reduced less than 2 pA. A diode area in the TEG pattern is formed as a size of 240 $\mu$m×300 $\mu$m. This means that leakage current density has been reduced less than $1.7 \times 10^{-8}$ A/cm². The result shown in FIG. 5 suggests that dislocation in the $n^+$-p junction causing leakage current can be suppressed in the first embodiment of the present invention.

Figure 6A:
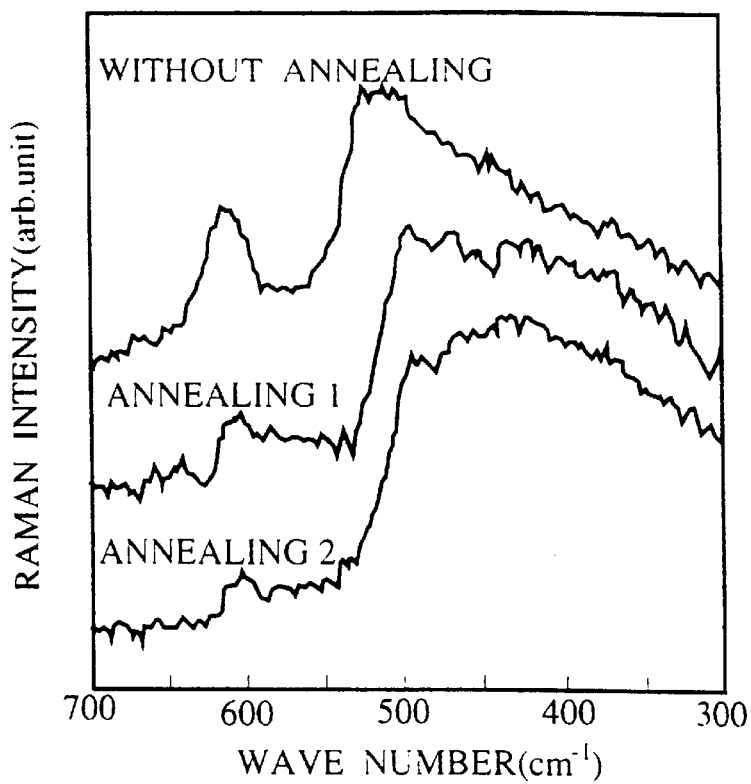
FIG. 6A is a view showing Raman scattering spectra of an oxide film with annealing (annealing 1, annealing 2) and without annealing.
Figure 6B:
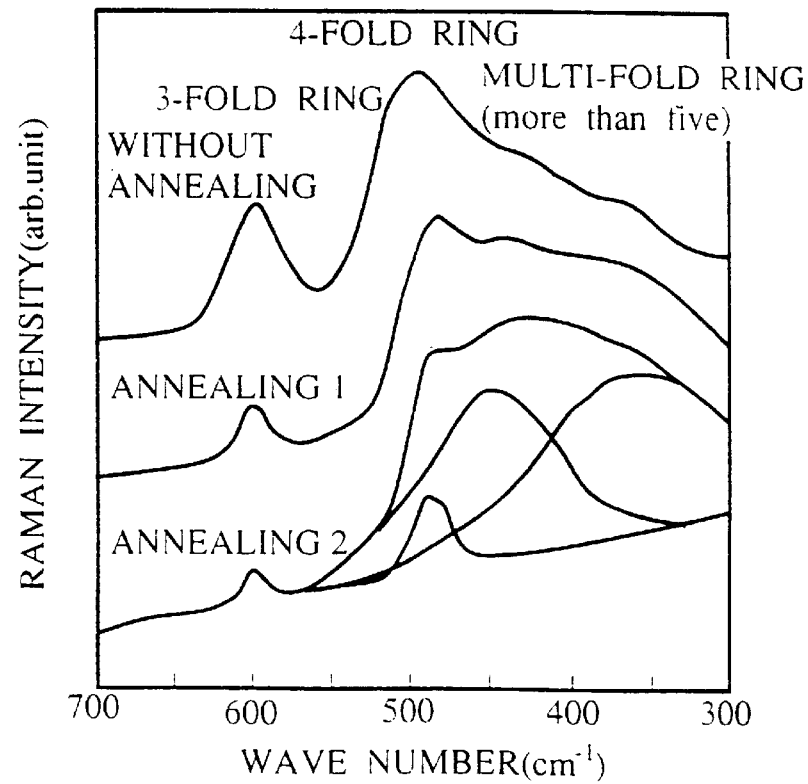
FIG. 6B is a view showing separated Raman scattering spectra in FIG. 6A in terms of simulation.
Figure 7A:
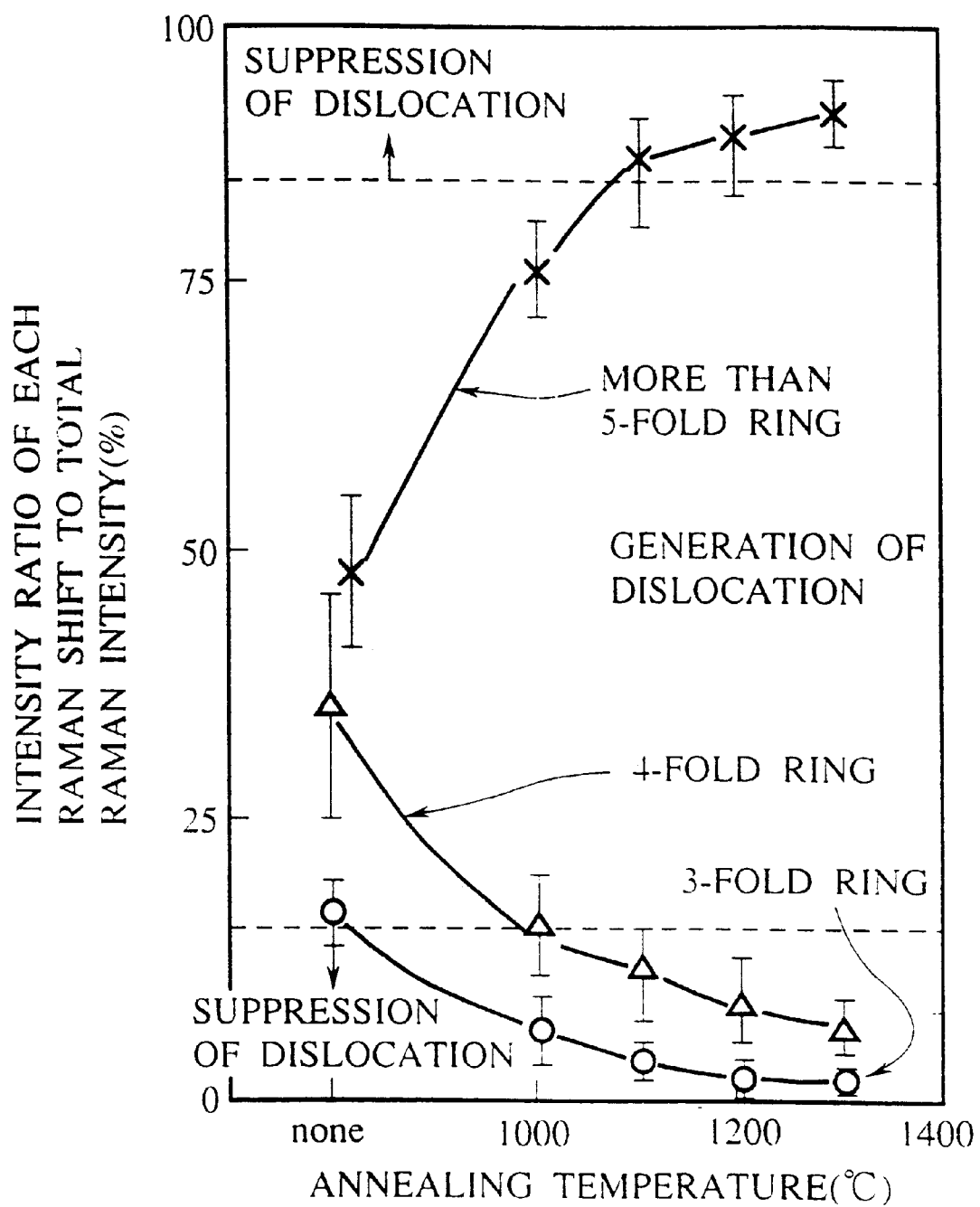
FIG. 7A is a view showing relationships between integrated intensity ratios of respective peaks in Raman scattering to total Raman intensity and annealing temperature of the oxide film.

FIGS. 6A, 6B and 7A are the results that a structure of the oxide film according to the first embodiment of the present invention enabling reduction in dislocation density and reduction in leakage current has been investigated in terms of Raman scattering. In particular, first the oxide film is formed uniformly on the silicon substrate according to the above buried insulating film forming method, and then, after the oxide film being annealed, the $SiO_2$ structure in the oxide film has been investigated by Raman spectroscopic analysis. $SiO_2$ has small Raman scattering sectional area and peaks of Raman scattering caused by vibration from the Si substrate becomes dominant in $SiO_2$. Hence, peaks of Raman scattering as shown in FIG. 6A were obtained by subtracting Raman scattering intensity of the silicon substrate without $SiO_2$ from that of the silicon substrate with $SiO_2$ on its surface. These peaks can be separated into 3-fold ring (cyclic trisiloxane), 4-fold ring (cyclic tetrasiloxane), and multi-fold ring (larger siloxane rings) such as more than 5-fold ring, as shown in FIG. 6B, if they are separated by simulation. The method of separating the ring structures with Galeener's assignment has been established by C. J. Breinker al., J. Non-cryst. Solids, 82 (1986) pp117–126, and the like. In FIG. 6A, annealing 1 is carried out at 1000° C. for one hour and annealing 2 is carried out at 1150° C. for one hour. Annealing 1 and 2 are carried out in $N_2$ gas atmosphere.

If integrated intensity of respective peaks in Raman scattering is measured every annealing temperature and then ratios of respective peaks in Raman scattering to total Raman integrated intensity (referred to as "integrated intensity ratios") are calculated, the results shown in FIG. 7A can be obtained. The total Raman integrated intensity means integrated intensity over wave number of 300 to 700 cm$^{-1}$, obtained by subtracting (removing) the background Raman intensity from the Si substrate. At more than 1100° C. from which generation of dislocation is suppressed, integrated intensity ratios for 3-fold ring and 4-fold ring are reduced while integrated intensity ratios for higher order ring such as more than 5-fold ring is increased. In other words, in the ring structure of $SiO_2$, if integrated intensity ratios for lower order ring less than 4-fold ring is substantially less than 15% with respect to total integrated intensity or integrated intensity ratios for higher order ring such as more than 5-fold ring is substantially more than 85% with respect to total integrated intensity, stress of buried material causing dislocation can be relaxed and thus dislocation can be suppressed. It can be deduced that, when considering error in measuring Raman scattering spectra, etc., advantages of the present invention can be achieved if lower order ring structure of less than 4-fold ring is below about 20% while higher order ring structure of more than 5-ring is above about 80%.

Figure 7B:
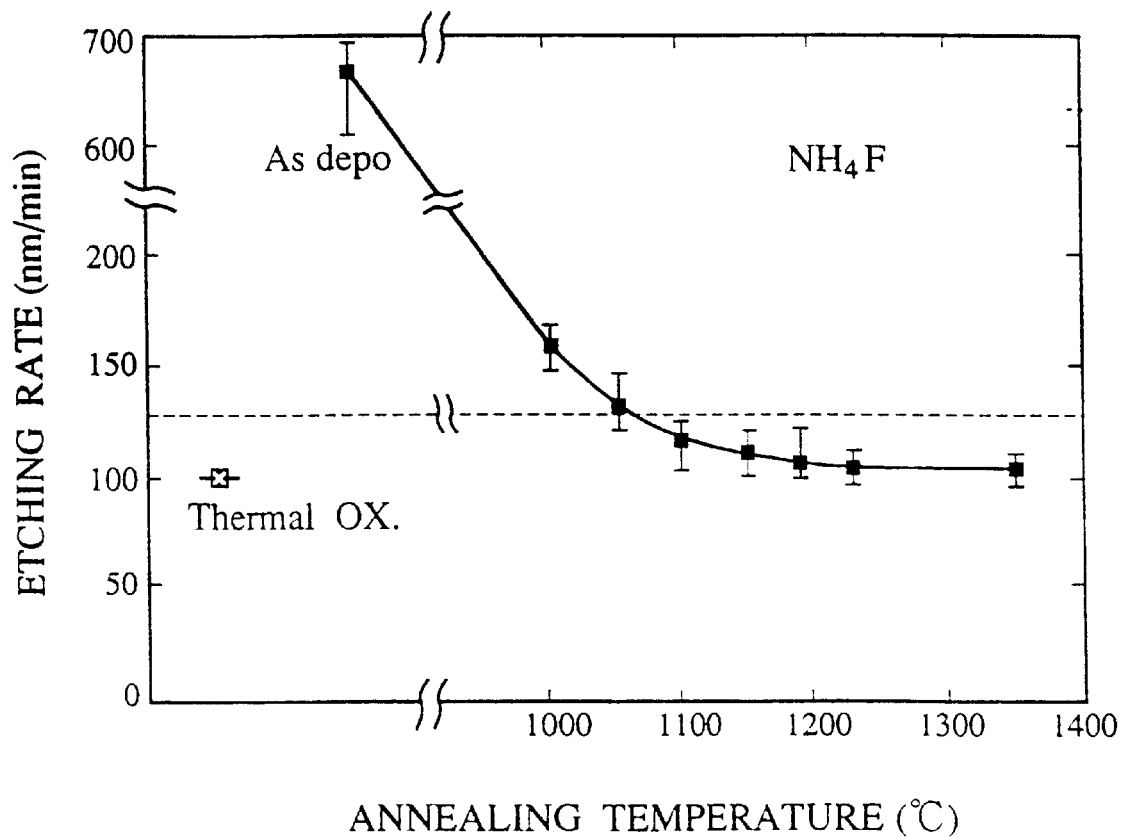
FIG. 7B is a view showing relationships between etching rates of the oxide film and annealing temperature.

FIG. 7B shows the etching rates of the oxide films, which are etched by ammonium fluoride ($NH_4F$) solution. Also included are the etching rate of thermal oxide film and "as depo" film, which is not annealed after deposition by the organic silicon based CVD.

The etching rates of oxide films annealed at substrate temperature over 1100° C. are less than 130 nm/min, which are approximately same as that of thermal oxide film as shown in FIG. 7B. Comparing with the result shown in FIG. 7A, this means that oxide films containing higher order ring more than 85% and lower order ring less than 15%, substantially, shows very low etching rate.

Although in FIG. 3B the oxide film 7 has been deposited in terms of CVD using organic silicon source such as TEOS, methods other than organic silicon based CVD may be adopted as the method of forming the oxide film. By way of example, a method called a so-called SOG (Spin-On-Glass) method may be employed. SOG method is such a method that resin glass obtained by melting polysiloxane in solvent such as acetone, xylene, or the like is coated by spinner, or the like and then $SiO_2$ film is formed by removing solvent in terms of prebake at 80 to 100° C. If annealing is carried out at 1100 to 1200° C. after $SiO_2$ film has been formed by the SOG method, the same effect as the described above can be attained. More particularly, in the case of the SOG method, dislocation can also suppressed and leakage current can also be reduced if integrated intensity ratios of multifold ring such as more than 5-fold ring derived from Raman scattering spectra is substantially more than 85% relative to total integrated intensity while integrated intensity ratios of 3-fold ring or 4-fold ring is substantially less than 15% relative to total integrated intensity. The resin glass has been set forth in U.S. Pat. Nos. 3,985,597 and 4,004,044. These resin glass are commercially available, for example, Allied Signal-Accuspin 418/720, Allied Signal-Accuglass T-11/T-14, Dow-Corning 805, Owens-Illinois 650, General Electric SR125/SR124, and the like. After prebake at 80 to 100° C., two step annealing employing low temperature annealing at 600° C. and then high temperature annealing at 1100 to 1350° C. may be used.

(Second Embodiment)

Figure 8A:
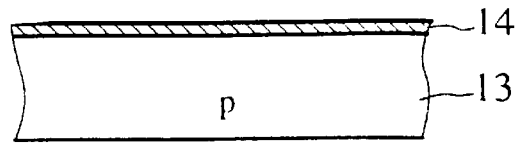
FIGS. 8A to 8F are cross-sectional views showing steps for manufacturing a buried element isolation semiconductor substrate for use in a bipolar integrated circuit according to a second embodiment of the present invention.
Figure 8B:
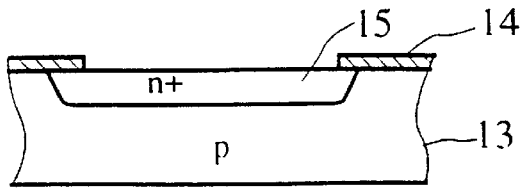
Figure 8C:
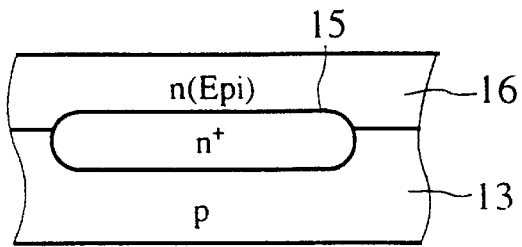
Figure 8D:
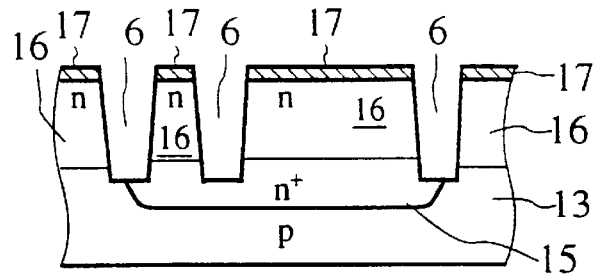
Figure 8E:
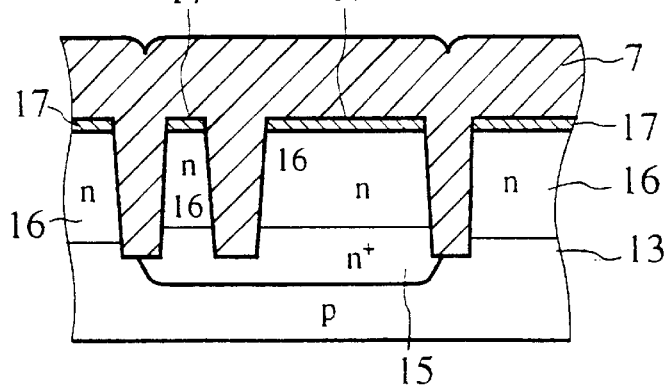
Figure 8F:
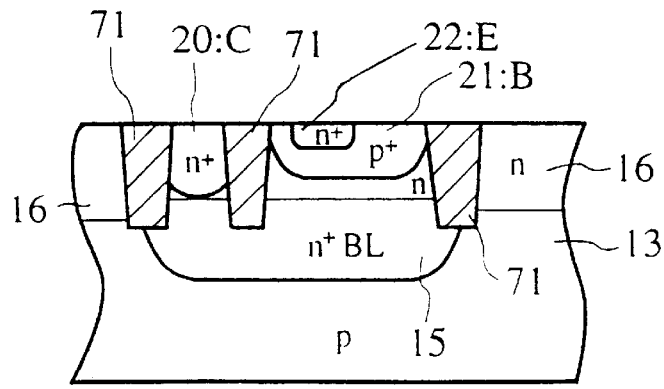

FIG. 8F is a cross-sectional view showing a structure of an element isolation semiconductor substrate for use in a bipolar integrated circuit according to a second embodiment of the present invention. FIGS. 8A to 8E are schematic cross-sectional views showing steps for manufacturing the semiconductor substrate having the final structure shown in FIG. 8F. A method of manufacturing the element isolation semiconductor substrate for use in the bipolar integrated circuit according to the second embodiment of the present invention comprises following steps.

(a) First, as shown in FIG. 8A, a 200 to 350 nm thick $SiO_2$ film 14 is formed on a surface of a p type silicon substrate 13 by means of steam oxidation.

(b) Then, as shown in FIG. 8B, a surface of part of the silicon substrate 13 is exposed by patterning $SiO_2$ film 14 by virtue of photolithography using photoresist as a mask to form a diffusion mask 14. An $n^+$ buried layer 15 is then formed by thermally diffusing Sb (antimony) or As (arsenic) into the silicon substrate 13 using the diffusion mask 14 to have impurity concentration of $3\times10^{20}$ cm$^{-3}$–$1\times10^{21}$ cm$^{-3}$.

(c) As shown in FIG. 8C, after the oxide film being removed, an n layer 16 of 2.5 $\mu$m thickness is formed by epitaxial growth on the silicon substrate 13 by decomposing silane compound such as $SiH_4$ or $SiH_2Cl_2$ and phosphorus compound such as $PH_3$ serving as doping gas at high temperature of 1050° C.–1200° C. while supplying $H_2$ carrier gas.

(d) An oxide film 17 is formed on the n layer 16 to have an about 0.3 $\mu$m thick and then photoresist pattern is formed on the oxide film 17 by photolithography. In turn, an etching mask 17 is formed by forming openings in the oxide film 17 using the photoresist as a mask. Then, as shown in FIG. 8D, after removing the photoresist, grooves having width of 0.5 $\mu$m are cut out to have a depth of about 3 $\mu$m in virtue of selective etching using the oxide film 17 as a mask (The aspect ratio is 3/0.5=6). RIE method using $CCl_4$ or $C_2Br_2F_4$ is employed to provide anisotropic in selective etching. Low temperature microwave plasma etching using $SF_6$ gas plasma is preferred if the grooves have high aspect ratio. For instance, plasma etching may be effected after the substrate is cooled at –80 to –150° C.

(e) In a similar manner as in the first embodiment of the present invention, as shown in FIG. 8E, the grooves are buried by CVD method using organic silicon source such as TEOS, TMOS, TPOS, or the like as material.

(f) Finally, as shown in FIG. 8F, after the surface of the resultant structure is planarized, annealing is carried out in $N_2$ atmosphere at high temperature of 1100 to 1350° C. for two hours. $O_2$, HCl, reductive gas, or inert gas other than $N_2$ gas may be used as atmosphere gas. Even when altering procedures into different orders from the above, the analogous effect can be accomplished if annealing at 1100 to 1350° C. is precedingly carried out immediately after CVD and then etching back is effected to planarize the surface. Using the grooves as element isolation regions, an $n^+$ collector leading region ($n^+$ sinker) 20, a $p^+$ base region 21, and an $n^+$ emitter region 22 are formed between the grooves, thereby finishing a bipolar transistor as shown in FIG. 8F. For simplicity, emitter metal electrode, collector metal electrode, interlayer insulating film, and the like are omitted in FIG. 8F, nevertheless such metal electrodes and insulating film are of course formed in the standard bipolar IC.

Figure 9:
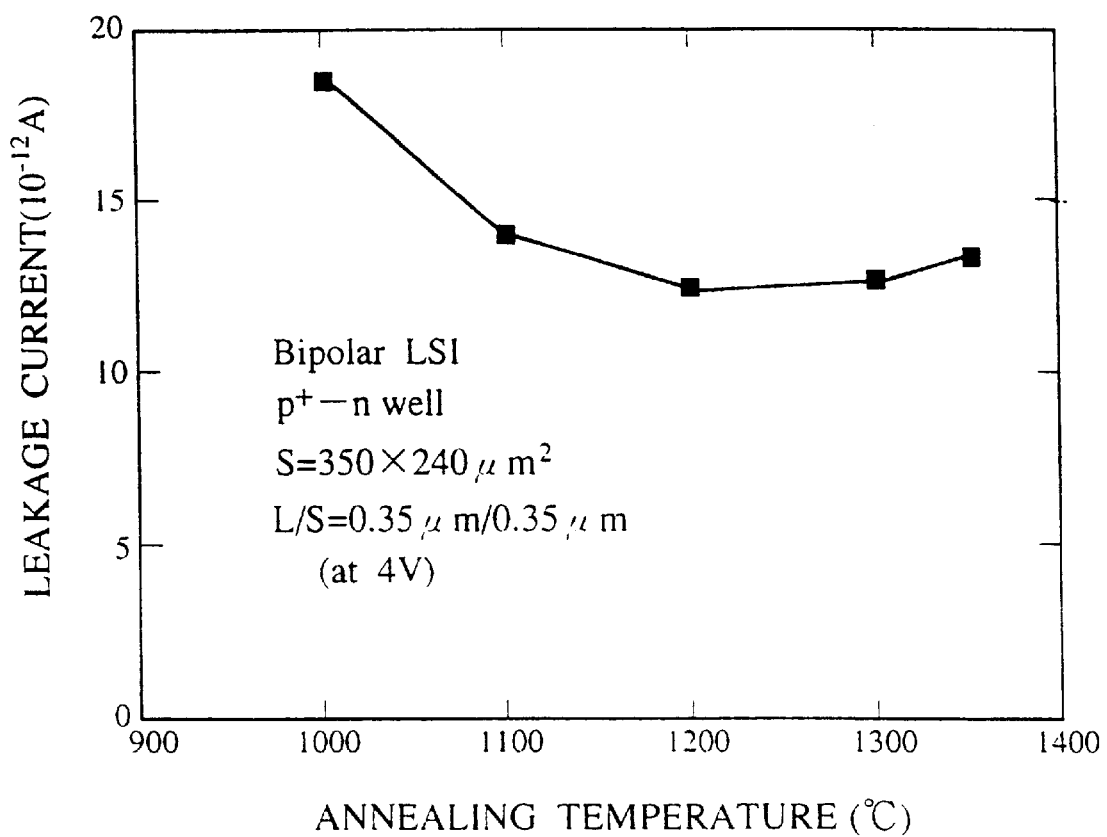
FIG. 9 is a view showing a relationship between annealing temperature of the buried oxide film and pn junction leakage current generated in Bipolar LSI formed in the device region.

FIG. 9 shows the results of device characteristics concerning leakage current investigated based on TEG pattern in the npn bipolar transistor according to the second embodiment of the present invention. According to TEG patterns corresponding to $p^+$-n junction formed between the $p^+$ base region 21 and the $n^+$ collector region 20, leakage currents are measured and then plotted relative to respective annealing temperatures. An area for a diode in TEG pattern is 240 $\mu$m×300 $\mu$m. It has been found that, within the temperature range of the present invention (1100 to 1350° C.), leakage current through the $p^+$-n junction can be reduced less than $1.7\times10^{-8}$ A/cm$^2$ so that dislocation due to such leakage current can be suppressed.

(Third Embodiment)

Figure 10A:
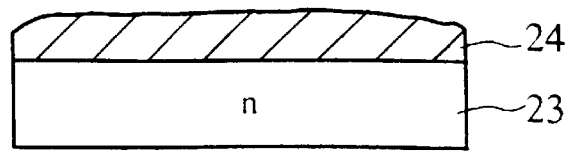
FIGS. 10A to 10G are cross-sectional views showing steps for manufacturing a buried element isolation semiconductor substrate for use in a BiCMOS integrated circuit according to a third embodiment of the present invention.
Figure 10B:
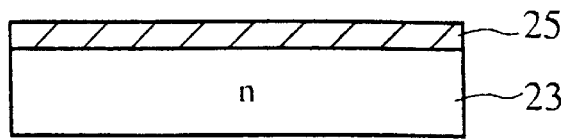
Figure 10C:
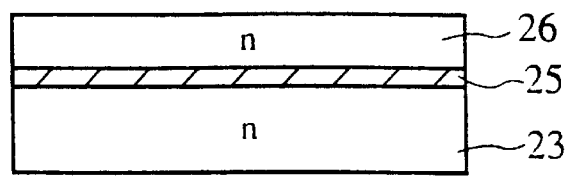
Figure 10D:
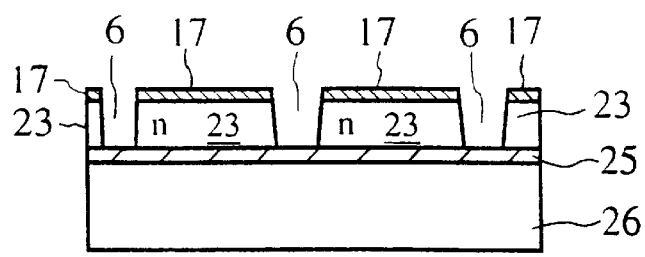
Figure 10E:
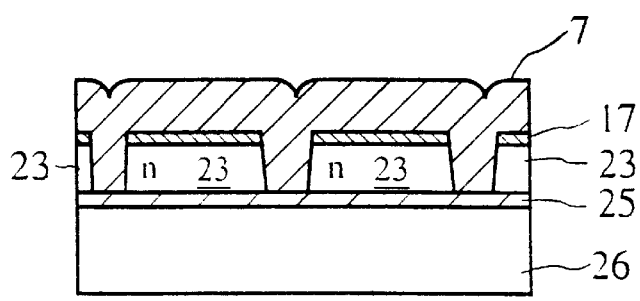
Figure 10F:
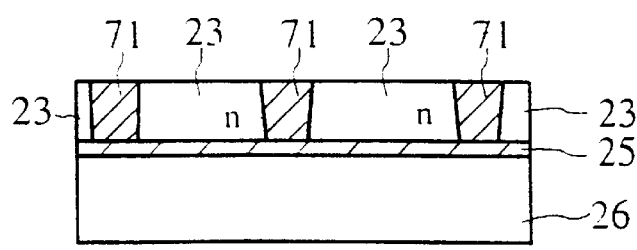
Figure 10G:
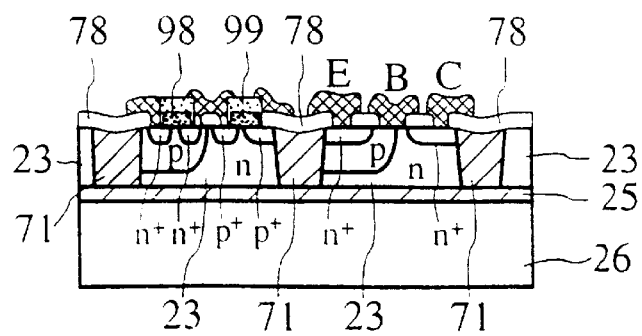

FIG. 10G is a cross-sectional view showing a element isolation semiconductor substrate according to a third embodiment of the present invention. FIGS. 10A to 10G are schematic cross-sectional views showing a manufacturing method to achieve the final structure in FIG. 10G. Although a case will be explained in the third embodiment of the present invention where the present invention is applied to a BiCMOS integrated circuit, it is a matter of course that the present invention may be applied to MOS integrated circuit, bipolar integrated circuit, static induction transistor (SIT) integrated circuit, or the like. A method of manufacturing a semiconductor substrate for BiCMOS integrated circuit according to the third embodiment of the present invention will be explained hereinbelow.

(a) First, as shown in FIG. 10A, on a surface of an n type silicon substrate 23 having predetermined face orientation such as (100) face, a 1 $\mu$m thick $SiO_2$ film 24 is formed in terms of the CVD method. In carrying out the CVD method, TEOS, HMDS (Hexamethyldisiloxane; $Si_2O(CH_3)_6$), OMCTS (Octamethylcyclotetrasiloxane; $c(OSi(CH_3)_2)_4$), or the like may be used as organic silicon source.

(b) Subsequently, the n type silicon substrate 23 having on top a $SiO_2$ film deposited as shown in FIG. 10A is annealed at 1100 to 1200° C. in $N_2$ atmosphere for two hours. After this, while a back surface of the substrate being secured by virtue of vacuum suction, the oxide film is planarized to a thickness of 0.3 $\mu$m in terms of chemical mechanical polishing (CMP), or the like to form a silicon direct bonding (abbreviated to "SDB" hereinafter) oxide film 25, as shown in FIG. 10B.

(c) Next, another silicon substrate 26 having a mirror surface is prepared. As shown in FIG. 10C, an SDB substrate can be obtained by mating the n type silicon substrate 23 and the mirror surface of the silicon substrate 26 together via the SDB oxide film 25 and then annealing at 1100° C. for one or two hours. At that time, annealing may be conducted while applying voltage to the substrate. Then, a thickness of the SDB substrate is adjusted by grinding, polishing the back surface of the n type silicon substrate 23 to a thickness of 1 $\mu$m. If lamination of the silicon substrates 23, 26 is effected at more than 1100° C., substantially the same effect as in annealing in the above (b) can be attained. Hence, if annealing in the above (b) would be omitted, annealing temperature in bonding the silicon substrates 23, 26 may also serve as such annealing. Also annealing at 1200° C. to stick the silicon substrates 23, 26 may be utilized, or else two-step procedure employing annealing at 1100° C. and annealing at 1200° C. may be utilized to bond the silicon substrates 23, 26.

(d) In the next, as shown in FIG. 10D, the n type silicon substrates 23 is turned up by putting the resultant structure in FIG. 10C upside-down. A thermal oxide film 17 having a 300 nm thickness is grown on a surface of the n type silicon substrates 23 formed by the SDB method. Using photolithography employing the photoresist as a mask, part of the thermal oxide film 17 is etched into predetermined patterns. The photoresist used as the etching mask for the thermal oxide film 17 is then stripped off. Using RIE by $CCl_4$, $SF_6$, etc. employing the thermal oxide film 17 thus obtained as a mask, as shown in FIG. 10D, part of the n type silicon substrates 23 is then etched to a depth of 1 μm until the SDB oxide film 25 is exposed, whereby U grooves 6 having width of 0.3 μm are formed (The aspect ratio of the groove is 1/0.3=3.3).

(e) Then, as shown in FIG. 10E, an $SiO_2$ film 7 is deposited to have a thickness of 1.1 to 1.5 μm in terms of, for example, low pressure CVD (LPCVD) method using TEOS, TMCTS (1,3,5,7-tetramethylcyclotetrasiloxane; $C(OSiHCH_3)_4$), TES (Triethylsilane; $SiH(C_2H_5)_3$), or the like as organic silicon source. In place of LPCVD, ECR plasma CVD or ICP-CVD may be used. As material buried in the U grooves 6, the organic silicon source into which oxidizing agent, for instance, $N_2O$, $O_2$, or $O_3$ is added may also be used. In addition, in terms of CVD using organic silicon source, silicon hydrogen compound such as $SiH_4$, or silicon chloride such as $SiCl_4$ alone or using a mixture of two kinds or more of above materials, the silicon oxide film 7 is buried in the U grooves 6. Oxidizing agent may also be added to respective materials above.

(f) Subsequently, as shown in FIG. 10F, by etching back the CVD-$SiO_2$ film 7 in terms of CDE method, or the like, a surface of the n type silicon substrates 23 is exposed other than U-grooves 6 buried areas to be planarized.

(g) Since the buried oxide films 71 formed in terms of organic silicon source, as shown in FIG. 10F, include a large quantity of impurity, e.g., moisture other than $SiO_2$, the resultant substrate is then annealed at 1100 to 1350° C. The annealing may be carried out in $N_2$ atmosphere for about two hours, for example. However, if $O_2$, HCl, reductive gas, inert gas, CO, or $CO_2$ is employed as atmosphere gas at that time, the similar results can be attained. After annealing, in the device region which is formed of the n type silicon substrate 23 surrounded by the buried oxide films 71, a CMOS circuit and a bipolar circuit are formed in terms of well known MOS processes and bipolar processes. Consequently, as shown in FIG. 10G, a BiCMOS integrated circuit is finished. Even if annealing at 1100 to 1350° C. under the condition shown in FIG. 10F is substituted for the annealing at 1100 to 1200° C. in the above (b), the objects of the present invention can be achieved substantially. In this event, it is advantageous to simplification of manufacturing steps.

As explained as above, in the event that insulating material formed by CVD using organic silicon source, e.g., TEOS as material is used as the element isolation insulating film, stress can be reduced on the basis of annealing in the third embodiment of the present invention. As a result, generation of dislocation or increase in dislocation in annealing can be suppressed during forming the element isolation regions or in succeeding element manufacturing steps. Therefore, according to the third embodiment of the present invention, the value of leakage current through the pn junction formed in the device region can be reduced below $1.7 \times 10^{-8}$ A/cm² so that high performance BiCMOS integrated circuit can be accomplished.

Figure 11:
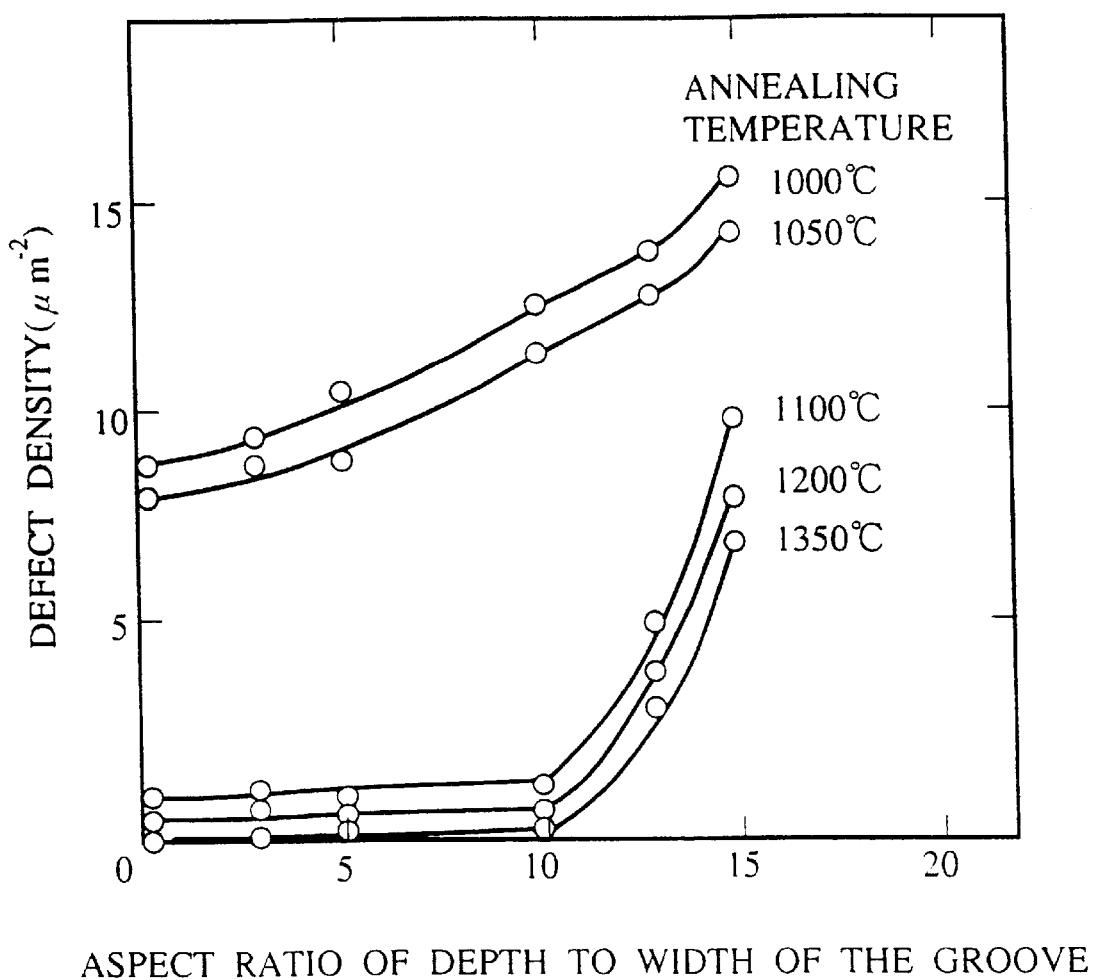
FIG. 11 is a view showing relationship between an aspect ratio of depth to width of the groove and defect density.

Since the aspect ratio $d/l_1$ of the depth d of the U-groove to the width $l_1$ of the U-groove in the first to third embodiments is given as an example, it must not be limited to the above explained aspect ratios. FIG. 11 shows the relationship between the defect density and the spectratio $d/l_1$ of the groove. As shown in FIG. 11, if the oxide films buried in the U-grooves having the aspect ratio $d/l_1$ of less than 10 are annealed under the annealing condition (1100 to 1350° C.) of the present invention, defect density can be decreased. It is to be noted that the aspect ratio $d/l_1$ of less than 10 must be appropriately selected. As shown in FIG. 11, it has been seen that, if annealing condition is out of the annealing temperature range of the present invention such as 1000° C., 1050° C., and the like, defect density cannot be reduced though the aspect ratio $d/l_1$ is less than 10.

Figure 12A:
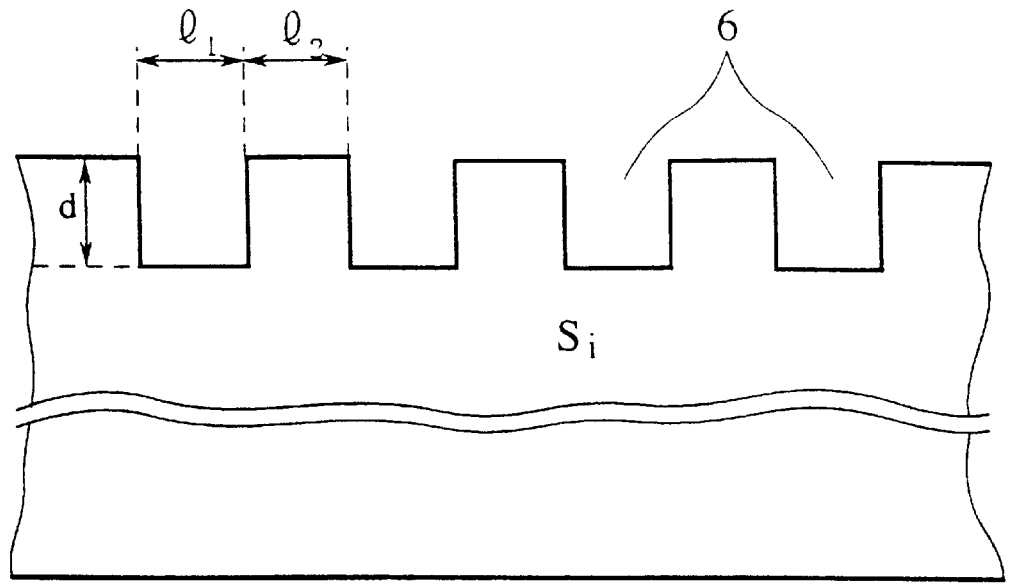
FIG. 12A is a schematic cross-sectional view showing a relationship between a width l1 of the groove and a width l2 of the device region.
Figure 12B:
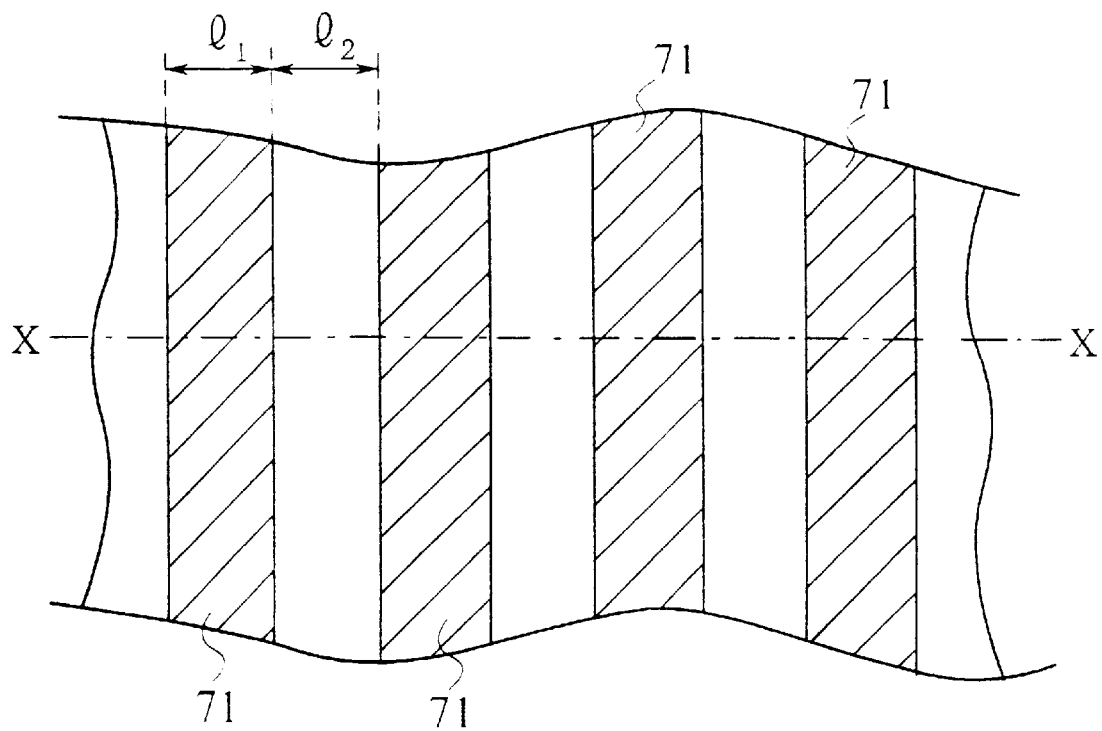
FIG. 12B is a schematic plan view corresponding to the cross-sectional view shown in FIG. 12A.
Figure 12C:
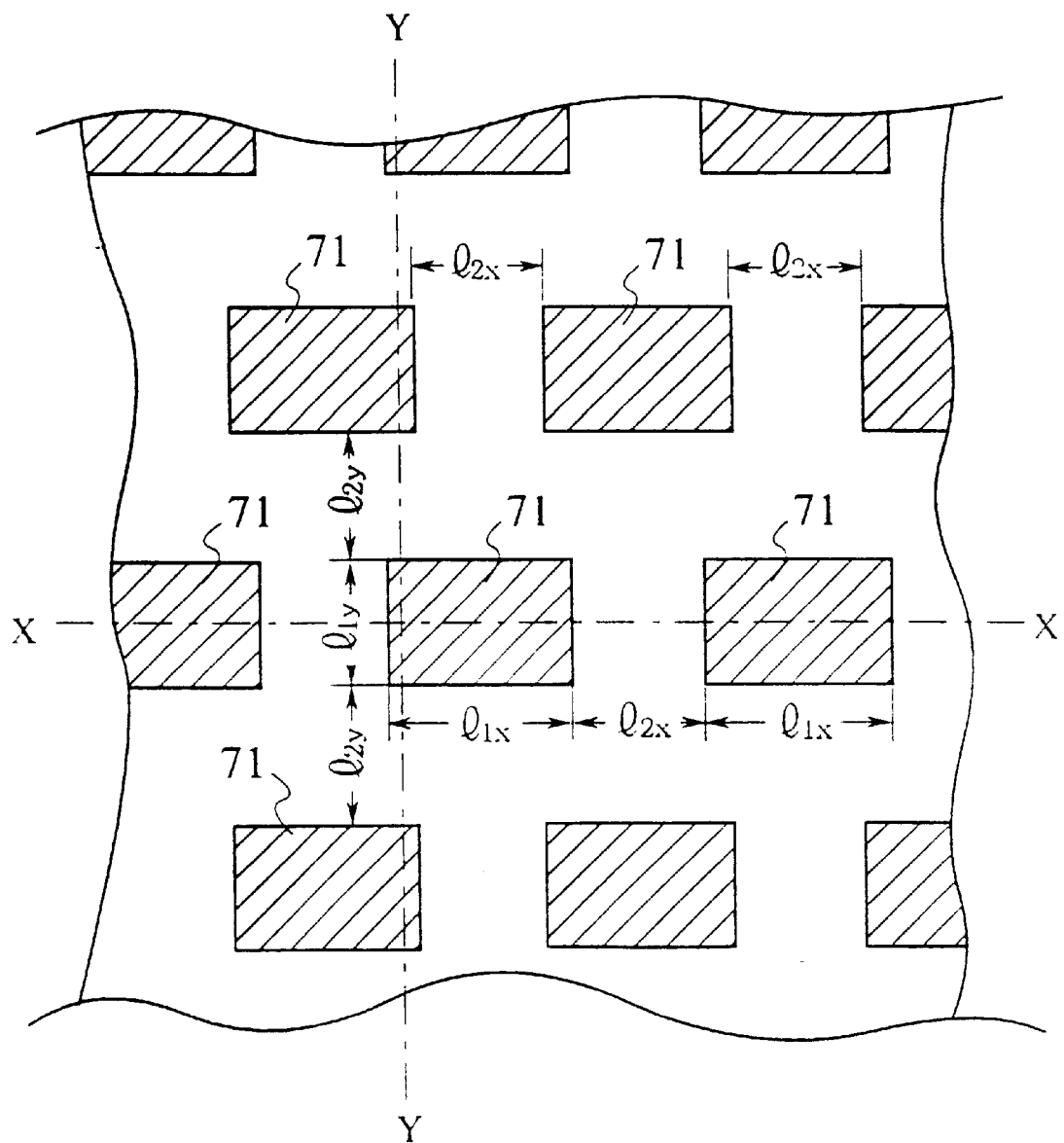
FIG. 12C is a schematic plan view showing two directions defining ratios of $l_{1x}/l_{2x}$ and $l_{1y}/l_{2y}$.
Figure 13:
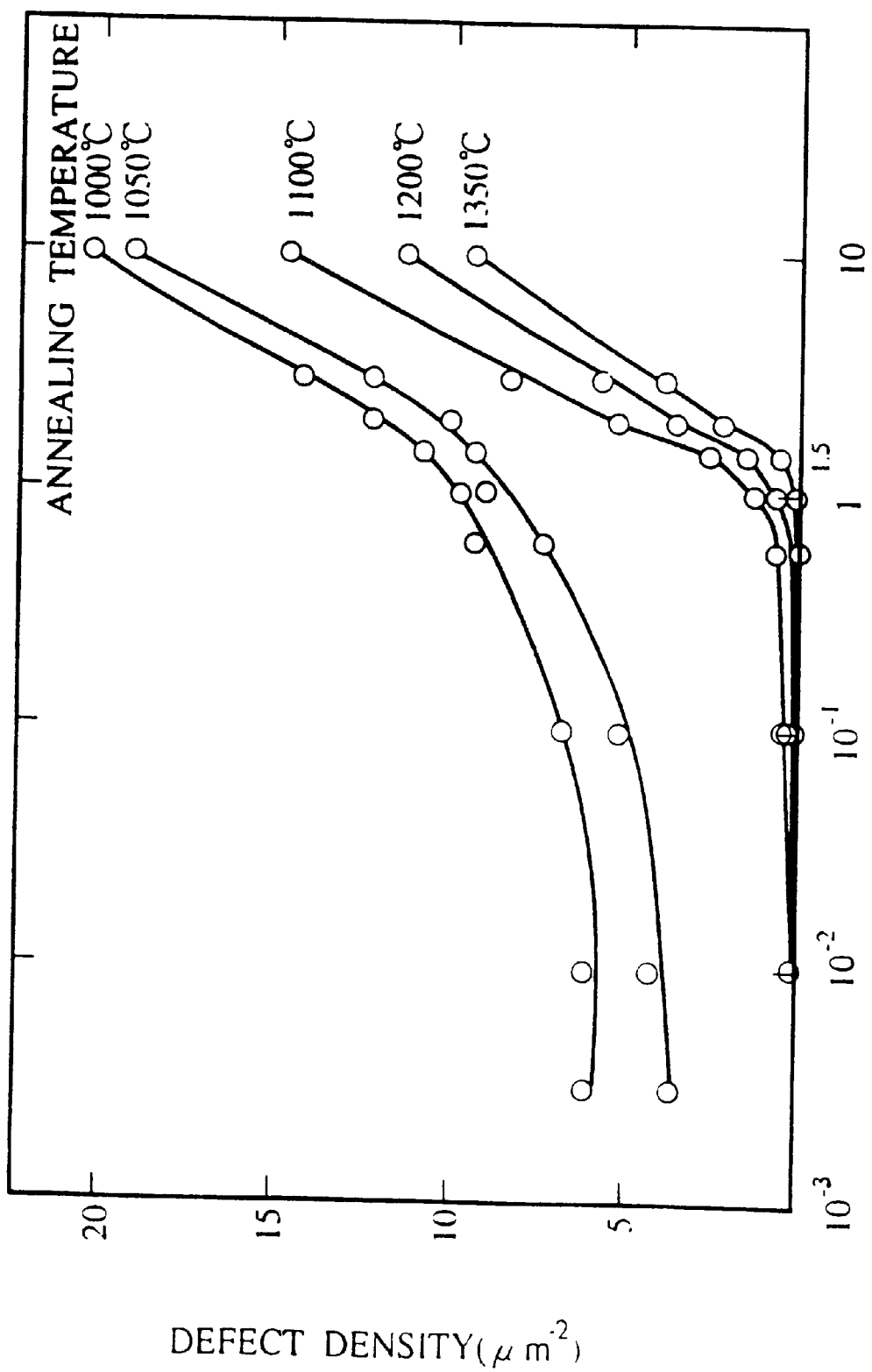
FIG. 13 is a view showing a relationship between a ratio of $l_1/l_2$ shown in FIG. 12 and defect density.

FIG. 13 shows the results of investigation about defect density (dislocation pit density) in the device region when a line-and-space ratio $l_1/l_2$ of a space width $l_1$ of the isolation groove to a line width $l_2$ of the device region is varied. In other words, after various buried element isolation substrates are fabricated by aligning the U-grooves 6 as the element isolation region, as shown in FIGS. 12A, 12B, 12C, while changing the line-and-space ratio $l_1/l_2$ of the minimum space width $l_1$ of the element isolation region to the minimum line width $l_2$ of the device region from 0.003 to 10 and then dislocation pits in respective device regions are actualized by selective etching, such dislocation pits are measured. FIG. 12B is a plan view corresponding to the cross-sectional view shown in FIG. 12A. FIG. 12C is another plan view showing the two directions of line and space patterns. In this case, in the same fashion as above, the buried oxide films using organic silicon material as CVD source are annealed at 1000, 1050, 1100, 1200, and 1350° C. for two hours respectively and then compared with each other. As shown in FIG. 13, if the ratio $l_1/l_2$ is in excess of 1.5, defects are enhanced. Consequently, it is evident that the present invention is available if the width $l_1$ of the element isolation region is less than 1.5 times as long as the width $l_2$ of the device region. If being within this range, arbitrary values other than this ratio $l_1/l_2$ in the first to third embodiments may be selected and be used.

For the case that there are two directions of cyclic line and space patterns such as observed in MOS dynamic random access memory (DRAM), it is enough that at least one line-and-space ratio measured at a specified direction satisfy the condition $l_1/l_2 \leq 1.5$. For example, if there were two directions of line-and-space ratios, namely $l_{1x}/l_{2x}$ along the line X—X and $l_{1y}/l_{2y}$ along the line Y—Y as shown in FIG. 12C, it is enough one of $l_{1y}/l_{2y}$ and $l_{1x}/l_{2x}$ is less than 1.5.

(Fourth Embodiment)

Figure 14A:
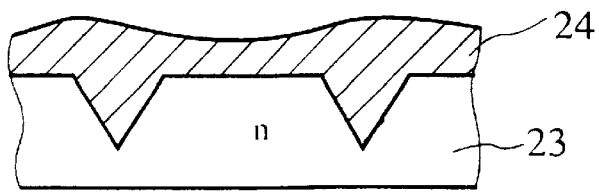
FIGS. 14A to 14E are cross-sectional views showing steps for manufacturing a buried element isolation semiconductor substrate for use in a CMOS integrated circuit according to a fourth embodiment of the present invention.
Figure 14B:
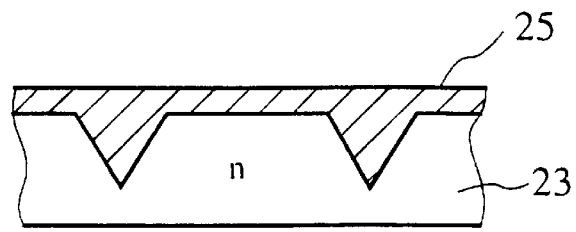
Figure 14C:
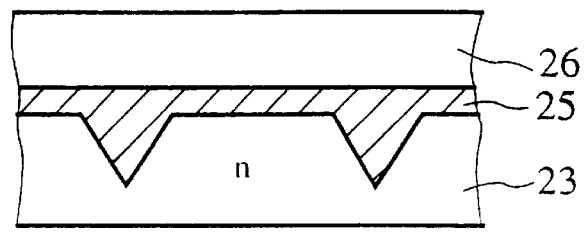
Figure 14D:
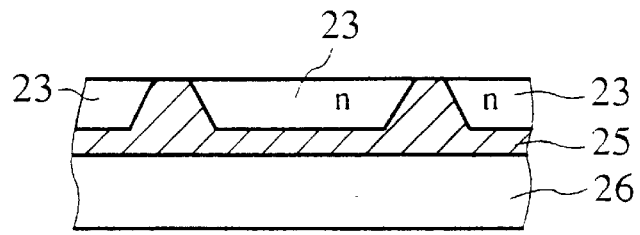
Figure 14E:
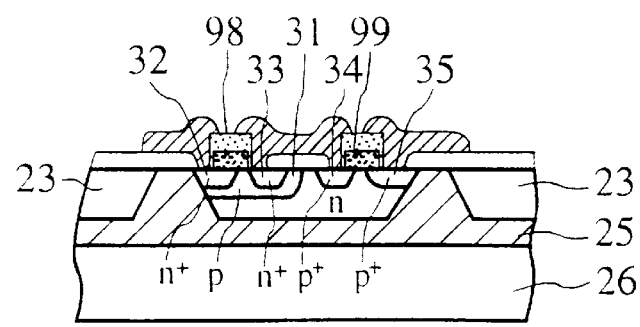

FIG. 14E is a cross-sectional view showing an element isolation semiconductor substrate according to a fourth embodiment of the present invention. FIGS. 14A to 14D are schematic cross-sectional views showing steps for manufacturing the element isolation semiconductor substrate shown in FIG. 14E. In the fourth embodiment of the present invention, a case will be explained where the present invention is applied to a CMOS integrated circuit. However, it is obvious that the present invention may be applied to other MOS integrated circuit such as nMOS integrated circuit, bipolar integrated circuit, BiCMOS integrated circuit, SIT integrated circuit, SMART POWER integrated circuit, and the like. A method of manufacturing the semiconductor substrate for use in the CMOS integrated circuit according to the fourth embodiment of the present invention comprises following steps.

(a) First an n type (100) face silicon substrate 23 is prepared and then, as shown in FIG. 14A, V-grooves are cut out up to a depth of 1.2 to 1.5 μm in predetermined locations on a surface of the substrate 23. The term "predetermined locations" means locations serving finally as the element isolation regions. The V-grooves may be formed by well known methods. Merely by way of example, a 150 to 300 nm thick thermal oxide film is formed on the n type silicon substrate 23, then predetermined areas of the thermal oxide film are removed by photolithography, and then using the thermal oxide film as a mask the n type silicon substrate 23 is etched by anisotropic etching employing potassium hydride (KOH) or ethylenediamine-pyrocatechol (EDP) solution. Such V-grooves are given as an example only, and U-grooves may be formed as in the first to third embodiments. In the case of U-grooves, they may be cut out up to a depth of 1.2 to 1.5 $\mu$m in terms of RIE using $CCl_4$, $SiCl_4$, $PCl_3$, $SF_6$, and so on, or ECR ion etching. In either case of U-grooves or V-grooves, it is preferable that a ratio $l_1/l_2$ of a width $l_1$ of the isolation groove to a width $l_2$ of the device region is set to less than 1.5. Subsequently, by LPCVD using organic silicon source such as TEOS, DADBS, OMCTS, TMS, HMD, and others, an oxide film is formed to have a thickness of about 1.7 to 2 $\mu$m. The term "thickness of about 1.7 to 2 $\mu$m" means a thickness of a flat portion where the groove is not formed. The spin-on-glass (SOG) may be coated by spinner or the like in place of organic silicon CVD.

(b) Next, the n type silicon substrate 23 which is subjected to $SiO_2$ CVD in FIG. 14A is annealed in $N_2$ atmosphere at 1200° C. for two hours. Thereafter, as shown in FIG. 14B, with fixing a back surface of the silicon substrate 23 by vacuum suction, an SDB oxide film 25 is formed by planarizing the oxide film by CMP method, or the like to a thickness of 0.3 $\mu$m. At this time, the same effect may be achieved if $O_2$, HCl, reductive gas, inert gas, or CO, $CO_2$ is used as the atmosphere gas.

(c) Then, another silicon substrate 26 a surface of which has already been mirror polished is prepared. As shown in FIG. 14C, the n type silicon substrate 23 and the silicon substrate 26 are mated together via the SDB oxide film 25 and then annealed at 1100 to 1150° C. for one to two hours. As a result, the SDB substrate is formed. In this event, annealing may be carried our by applying pulse voltage under low pressure (vacuum) condition. For instance, pressure is lowered up to 0.1 Pa and then pulse voltage of ±350 V is applied for about ten minutes at 800° C.

(d) Next, if the back surface of the n type silicon substrate 23 is polished until the n type silicon substrate 23 has a thickness of 1 $\mu$m, part of the SDB oxide film 25 is exposed on the back surface of the n type silicon substrate 23. FIG. 14D is a sectional view showing the substrate in this state wherein the n type silicon substrate 23 is located on the upper side by putting the structure in FIG. 14C upside-down. Accordingly, the device region 23 surrounded by the buried oxide film 25 can be completed.

(e) As shown in FIG. 14E, a p well 31 is formed in the device region 23 by well known MOS processes, then $n^+$ source/drain regions 32, 33 are formed in the p well 31, then $p^+$ source/drain regions 34, 35 are formed in the device region wherein the p well 31 is not formed, and then a gate oxide film, polysilicon gate electrode 98, 99, and metal wirings are formed on a surface of the resultant structure. Consequently, the CMOS integrated circuit according to the fourth embodiment of the present invention can be accomplished.

In the fourth embodiment of the present invention, the SDB oxide film and the buried oxide film can be formed simultaneously by the same organic silicon system CVD (or coating of SOG). Therefore, the number of manufacturing step can be reduced rather than the third embodiment shown in FIGS. 10A to 10G to increase productivity of the device. Since the number of annealing process can be reduced in contrast to the third embodiment, the semiconductor device can be manufactured with fewer heat history and therefore reduction in crystalline defect and achievement of miniaturized structure can be facilitated.

The organic silicon based CVD is superior in step coverage. And, in addition, the formation of the SDB oxide film by the organic silicon based CVD can form a thick oxide film at low temperature and short time rather than the case the SDB oxide film is formed by conventional thermal oxidation. Hence, there is no fear of generation of oxidation-induced stacking fault (OSF) caused by high-temperature and long-term thermal oxidation. Accordingly, fewer crystalline defect can be generated in the device region and as a result leakage current can be reduced in the CMOS circuit. Because of excellent step coverage, using the substrates having various uneven surface shapes, the SOI substrate can be fabricated without affecting surface planarization, though not limited to the case shown in FIG. 14A.

Although the U-grooves may be used, as stated earlier in the fourth embodiment of the present invention, it is a matter of course that an aspect ratio of less than 10 is preferred in that case. In addition, in the case of V-grooves, it is also preferable that a ratio of $d_v/l_{v1}$ of a depth $d_v$ to a width $l_{v1}$ of the opening on the surface side of the V groove is set to less than 10.

As explained above, in the CMOS integrated circuit, when the insulating material formed by CVD using organic silicon compound such as TEOS as CVD source is used as the element isolation film, stress can be reduced and generation or multiplication of dislocation can be reduced in annealing steps during or after forming the element isolation region if annealing condition according to the fourth embodiment of the present invention is applied. As a result, according to the fourth embodiment of the present invention, leakage current through the pn junction formed in the device region can be reduced less than $1.7\times10^{-8}$ A/cm$^2$ and thus high performance CMOSLSI can be achieved.

Various modifications will become possible for those skilled in the art after receiving the teachings of the present disclosure without departing from the scope thereof.

In the first to fourth embodiments of the present invention, although the case has been explained where the silicon oxide film ($SiO_2$ film) is deposited in terms of the atmospheric pressure CVD or LPCVD method, CVD of the $SiO_2$ may be effected in terms of liquid phase CVD method. In this case, the silicon oxide film can be deposited by microwave-discharging $O_2$ gas to react to TMS while the substrate temperature is set to –40° C. below a boiling point of deposited particle. After liquid phase CVD method, if annealing is carried out in a similar fashion as in the first to fourth embodiments of the present invention, the same effect as the above embodiments can be achieved. In addition, a small quantity of potassiumnitride is added employing ethylene glycol as electrolyte solution and N-methylacetamide as solvent, and thus the $SiO_2$ film may be formed in U-grooves by means of anodic oxidation using the silicon substrate as the anode and platinum as the opposite electrode. In this event, if annealing is carried out at substrate temperature of 1100 to 1350° C. as being similar to the above embodiments, the same effect as the above embodiments can be achieved. Alternatively, the $SiO_2$ film may be buried into U-grooves in terms of plasma CVD.

What is claimed is:

1. A semiconductor substrate having an element isolation region formed at the upper surface of a semiconductor substrate and a device region sandwiched by the element isolation region, the element isolation region comprising:

(a) a plurality of rectangular grooves arranged in the semiconductor substrate; each groove having a depth d and a width $l_{1x}$ so as to make an aspect ration $d/l_{1x}$ less than 10 and a line-and-space ratio $l_{1x}/l_{2x}$ less than 1.5 wherein $l_{2x}$ is a space between the grooves measured along the direction of $l_{1x}$; and (b) buried oxide films formed in the grooves, the buried oxide films being formed by any or organic silicon based CVD method, spin-on-glass coating method, and anodic oxidation method and being composed of a stress relaxed structure annealed at a temperature of 1100 to 1350° C. so that dislocation density generated in the semiconductor substrate in vicinity of the grooves is less than $1/\mu m^2$.

2. The semiconductor substrate of claim 1, wherein each of said plurality of grooves has an opening having the width $l_{1x}$ and a height $l_{1y}$ so as to make another line-and-space ratio $l_{1y}/l_{2y}$ larger than 1.5, with $l_{2y}$ being a space between the grooves measured along the direction of $l_{1y}$.

3. The semiconductor substrate of claim 1, wherein the width $l_{1x}$ is less than 0.5 $\mu$m.

4. The semiconductor substrate of claim 1, wherein the aspect ratio $d/l_{1x}$ is higher than 1.

5. The semiconductor substrate of claim 1, wherein an etching rate of the buried oxide films is less than 130 nm/min, substantially the same as that of a thermal oxide film.

6. A semiconductor substrate having an element isolation region formed at the upper surface of a semiconductor substrate and a device region sandwiched by the element isolation region, the element isolation region comprising:

(a) a plurality of rectangular grooves arranged in the semiconductor substrate; each groove having a depth d and a width $l_{1x}$ so as to make an aspect ratio $d/l_{1x}$ less than 10 and a line-and-space ratio $l_{1x}/l_{2x}$ less than 1.5 wherein $l_{2x}$ is a space between the grooves measured along the direction of $l_{1x}$; and (b) buried oxide films formed in the grooves, each of the buried oxide films being formed by any of organic silicon based CVD method, spin-on-glass coating method, and anodic oxidation method so as to be a non-crystalline silicon oxide film which includes higher order ring structures higher than 5-fold ring and lower order ring structures lower than 4-fold ring at respective predetermined rates so that an etching rate by ammonium fluoride solution of the non-crystalline silicon oxide film is less than 130 nm/min, substantially same as that of a thermal oxide film.

7. The semiconductor substrate of claim 6, wherein the width $l_{1x}$ is less than 0.5 $\mu$m.

8. The semiconductor substrate of claim 6, wherein the aspect ratio $d/l_{1x}$ is higher than 1.

9. The semiconductor substrate of claim 6, wherein each of said plurality of grooves has an opening having the width $l_{1x}$ and a height $l_{1y}$ so as to make another line-and-space ratio $l_{1y}/l_{2y}$ larger than 1.5, with $l_{2y}$ being a space between the grooves measured along the direction of $l_{1y}$.

10. A semiconductor substrate having an element isolation region formed at the upper surface of a semiconductor substrate and a device region sandwiched by the element isolation region, the element isolation region comprising:

(a) grooves formed in the semiconductor substrate; and (b) buried oxide films formed in the grooves, the buried oxide films being formed of the non-crystalline silicon oxide film which includes higher order ring structures higher than 5-fold ring and lower order ring structures lower than 4-fold ring at respective predetermined rates, the respective predetermined rates of the ring structures are determined according to rates of integrated Raman intensities corresponding to respective ring structures to a total integrated Raman intensity, and the structures are formed to satisfy either of or both conditions that the higher order ring structures than 5-fold ring are substantially more than 85% of an overall structure and the lower order ring structures than 4-fold ring are substantially less than 15% of the overall structure.

11. The semiconductor substrate of claim 10, wherein said grooves are arranged in the semiconductor substrate, each groove having a depth d, a height $l_{1y}$ and a width $l_{1x}$ so as to make an aspect ratio $d/l_{1x}$ less than 10, a line-and-space ratio $l_{1x}/l_{2x}$ less than 1.5 and another line-and-space ratio $l_{1y}/l_{2y}$ larger than 1.5, wherein $l_{2x}$ and $l_{2y}$ are spaces between the grooves measured along the direction of $l_{1x}$ and $l_{1y}$, respectively.

12. The semiconductor substrate of claim 10, wherein dislocation density generated in the semiconductor substrate in vicinity of the grooves is less than $1/\mu m^2$.

13. The semiconductor substrate of claim 10, wherein an etching rate of the non-crystalline silicon oxide film is less than 130 nm/min, substantially the same as that of a thermal oxide film.

14. The substrate of claim 10, wherein the buried oxide films are formed by any of organic silicon based CVD method, spin-on-glass coating method, and anodic oxidation method, and are composed of an oxide film which is annealed at a temperature of 1100 to 1350° C.

15. The substrate of claim 10, wherein an aspect ratio $d/l_1$ which is defined by a dimensional ratio of a depth d of the grooves to a width $l_1$ of openings of the grooves is less than 10.

16. The substrate of claim 10, wherein a repetitive pattern having a line-and-space ratio $l_1/l_2$, which is defined as a ratio of a minimum space width l1 corresponding to a width of openings of the grooves to a minimum line width $l_2$ corresponding to a width of the device region, of less than 1.5 are formed along a specified direction at a surface of the semiconductor substrate.

* * * * *